United States Patent
Saifuddin et al.

(10) Patent No.: US 9,754,655 B2
(45) Date of Patent: Sep. 5, 2017

(54) CONTROLLING A REFRESH MODE OF A DYNAMIC RANDOM ACCESS MEMORY (DRAM) DIE

(71) Applicant: QUALCOMM Incorporated, San Diego, CA (US)

(72) Inventors: Mosaddiq Saifuddin, San Diego, CA (US); SankaraRao Kunapareddy, San Diego, CA (US); Keunsoo Roh, San Diego, CA (US); Chun Xiang He, San Diego, CA (US); Pratik Patel, San Diego, CA (US); Nicholas Ambur, San Diego, CA (US); Jeremy Haugen, Vista, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/340,266

(22) Filed: Nov. 1, 2016

(65) Prior Publication Data
US 2017/0148504 A1 May 25, 2017

Related U.S. Application Data

(60) Provisional application No. 62/259,584, filed on Nov. 24, 2015.

(51) Int. Cl.
*G11C 16/06* (2006.01)
*G11C 11/406* (2006.01)
(Continued)

(52) U.S. Cl.
CPC ...... *G11C 11/40615* (2013.01); *G06F 1/3225* (2013.01); *G06F 1/3275* (2013.01); *G06F 13/1636* (2013.01); *G11C 7/1072* (2013.01); *G11C 11/4087* (2013.01); *G11C 11/40611* (2013.01); *G11C 11/40618* (2013.01); *G11C 11/40622* (2013.01)

(58) Field of Classification Search
CPC .............. G11C 16/06; G11C 11/40615; G11C 11/40611
USPC ........................................ 365/185.01–185.33
See application file for complete search history.

(56) References Cited

U.S. PATENT DOCUMENTS 6,334,167 B1   12/2001   Gerchman et al.
6,865,131 B2   3/2005    Sawhney
(Continued)

OTHER PUBLICATIONS

International Search Report and Written Opinion—PCT/US2016/060632—ISA/EPO—dated Jan. 26, 2017.

*Primary Examiner* — Harry W Byrne
(74) *Attorney, Agent, or Firm* — Muncy, Geissler, Olds & Lowe, P.C.

(57) ABSTRACT

In an embodiment, a dynamic random-access memory (DRAM) system configures an inactive portion of a DRAM die to operate in accordance with a self-refresh mode that is characterized by refreshes of the DRAM die being controlled by a local DRAM die controller integrated into the DRAM die. The DRAM system also configures an active portion of the DRAM die to operate in accordance with a controller-managed refresh mode while the inactive portion of the DRAM die operates in the self-refresh mode, the controller-managed refresh mode characterized by refreshes of the DRAM die being controlled by a controller that is external to the DRAM die.

30 Claims, 16 Drawing Sheets

(51) Int. Cl.
  *G11C 7/10*    (2006.01)
  *G11C 11/408*  (2006.01)
  *G06F 13/16*   (2006.01)
  *G06F 1/32*    (2006.01)

(56) References Cited

U.S. PATENT DOCUMENTS

| | | |
|---|---|---|
| 7,158,434 B2 | 1/2007 | Hokenmaier |
| 7,349,278 B2 * | 3/2008 | Min ................. G11C 11/40622 365/205 |
| 7,953,921 B2 | 5/2011 | Walker et al. |
| 9,311,983 B2 | 4/2016 | Schaefer |
| 2003/0028711 A1 | 2/2003 | Woo et al. |
| 2007/0014175 A1 * | 1/2007 | Min ................. G11C 11/40622 365/222 |
| 2011/0296098 A1 | 12/2011 | Sauber et al. |
| 2014/0068172 A1 | 3/2014 | Zheng et al. |

* cited by examiner

CONTROLLING A REFRESH MODE OF A DYNAMIC RANDOM ACCESS MEMORY (DRAM) DIE

CROSS-REFERENCE TO RELATED APPLICATION

The present Application for Patent claims the benefit of U.S. Provisional Application No. 62/259,584, entitled "MIXED DYNAMIC RANDOM ACCESS MEMORY (DRAM) MANAGEMENT", filed Nov. 24, 2015, which is by the same inventors as the subject application, assigned to the assignee hereof and hereby expressly incorporated by reference herein in its entirety.

TECHNICAL FIELD

Embodiments relate to controlling a refresh mode of a dynamic random access memory (DRAM) die.

BACKGROUND

Semiconductor memory devices include, for example, static random access memory (SRAM) and dynamic random access memory (DRAM). A DRAM cell generally includes one transistor and one capacitor. The capacitor can be either charged or discharged to store information as a corresponding bit value (e.g., 0 or 1). Because capacitors leak charge, the stored information eventually fades unless the capacitor charge is refreshed periodically. Due to the refresh requirement, DRAM is referred to as dynamic memory as opposed to SRAM and other static memory.

DRAM scaling continues to increase the total number of bits (or cells) for each DRAM chip (or die), directly impacting the specification of DRAM refresh operations, the process by which a cell's value is kept readable. The specification of DRAM refresh operations includes, for DRAM dies operating in a controller-managed refresh mode whereby refreshes of the DRAM die are controlled by a controller that is external to the DRAM die, the interval at which refresh commands are sent to each DRAM die (tREF) and the amount of time that the refresh command occupies the DRAM interface and the DRAM die conducts the refresh (tRFC). Unfortunately, DRAM scaling increases the number of weak retention rows (e.g., rows that have at least one cell that has a reduced retention time). Such rows involve additional refresh cycles to maintain the stored information. A significant performance and power consumption impact is caused by the increased refresh cycles in a system on chip (SoC) or other like computer architecture. Otherwise, potential DRAM chip (or die) yield loss results without increased refresh cycles.

BRIEF DESCRIPTION OF THE DRAWINGS

A more complete appreciation of embodiments of the disclosure will be readily obtained as the same becomes better understood by reference to the following detailed description when considered in connection with the accompanying drawings, which are presented solely for illustration and not limitation of the disclosure, and in which.

SUMMARY

Figure 1:
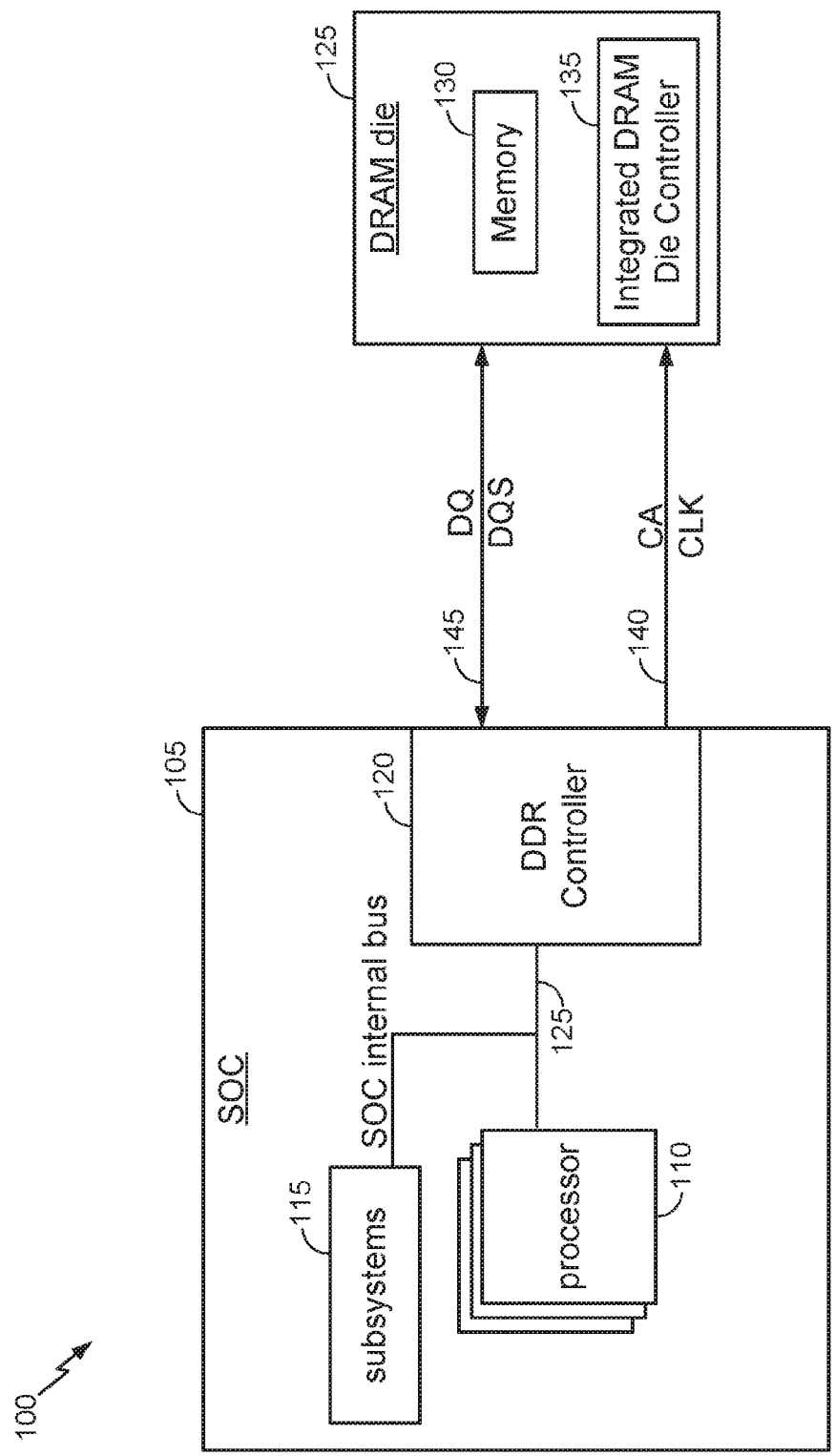
FIG. 1 illustrates a dynamic random-access memory (DRAM) system in accordance with an embodiment of the disclosure.

An embodiment is directed to a method of performing refresh operations within a dynamic random-access memory (DRAM) system, including configuring an inactive portion of a DRAM die to operate in accordance with a self-refresh mode that is characterized by refreshes of the DRAM die being controlled by a local DRAM die controller integrated into the DRAM die, and configuring an active portion of the DRAM die to operate in accordance with a controller-managed refresh mode while the inactive portion of the DRAM die operates in the self-refresh mode, the controller-managed refresh mode characterized by refreshes of the DRAM die being controlled by a controller that is external to the DRAM die.

Another embodiment is directed to a DRAM system, including a DRAM die containing a local DRAM die controller integrated therein, and a controller that is external to the DRAM die and configured to configure an inactive portion of the DRAM die to operate in accordance with a self-refresh mode that is characterized by refreshes of the DRAM die being controlled by the integrated DRAM die controller, and configure an active portion of the DRAM die to operate in accordance with a controller-managed refresh mode while the inactive portion of the DRAM die operates in the self-refresh mode, the controller-managed refresh mode characterized by refreshes of the DRAM die being controlled by the external controller.

An embodiment is directed to a DRAM system, including means for configuring an inactive portion of a DRAM die to operate in accordance with a self-refresh mode that is characterized by refreshes of the DRAM die being controlled by a local DRAM die controller integrated into the DRAM die and means for configuring an active portion of the DRAM die to operate in accordance with a controller-managed refresh mode while the inactive portion of the DRAM die operates in the self-refresh mode, the controller-managed refresh mode characterized by refreshes of the DRAM die being controlled by a controller that is external to the DRAM die.

An embodiment is directed to a non-transitory computer-readable medium containing instructions stored thereon, which, when executed by a DRAM system, cause the DRAM system to perform operations, the instructions including at least one instruction to cause the DRAM system to configure an inactive portion of a DRAM die to operate in accordance with a self-refresh mode that is characterized by refreshes of the DRAM die being controlled by a local DRAM die controller integrated into the DRAM die and at least one instruction to cause the DRAM system to configure an active portion of the DRAM die to operate in accordance with a controller-managed refresh mode while the inactive portion of the DRAM die operates in the self-refresh mode, the controller-managed refresh mode characterized by refreshes of the DRAM die being controlled by a controller that is external to the DRAM die.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. Nevertheless, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Dynamic random access memory (DRAM) scaling continues to increase the total number of bits (or cells) for each DRAM chip (or die). This increased capacity directly impacts the specification of DRAM refresh operations, the process by which a bit cell's value is kept readable. The specification of DRAM refresh operations includes, for DRAM dies operating in a controller-managed refresh mode whereby refreshes of the DRAM die are controlled by a controller that is external to the DRAM die, the interval at which refresh commands are sent to each DRAM (tREFI), and the amount of time that the refresh command occupies the DRAM interface while the DRAM die conducts the refresh (tRFC). Unfortunately, DRAM scaling also increases the number of weak retention rows (e.g., rows that have at least one cell with a reduced retention time). Such rows involve increased refresh cycles for maintaining the stored information. Unfortunately, potential DRAM chip (or die) yield loss from the increased number of weak retention rows results without the increased refresh cycles.

Performance and power consumption for the DRAM in a system on chip (SoC) or other like mobile computer architecture may be impacted by an increase in the number of refresh cycles. For example, lowering the refresh current for low memory use cases may provide benefits in automotive applications, as well as Internet of Things (IoT) applications. In particular, lowering the refresh current may be useful in automotive/IoT solutions where small processes run for an extended amount of time on a low power budget.

Well-known DRAM refresh modes for managing memory refreshes include auto-refresh mode (or controller-managed refresh mode), self-refresh mode and partial-array refresh (PASR) mode.

In controller-managed refresh mode, refreshes of the DRAM die are controlled via auto refresh commands issued by a controller (e.g., a double data rate (DDR) controller) that is external to the DRAM die. The refreshes issued by the controller in accordance with the controller-managed refresh mode are configured to comply with the DRAM specification. For example, one example DRAM specification specifies a refresh rate of eight thousand (8 k) refresh operations to be performed each thirty-two (32) milliseconds (ms).

In self-refresh mode, refreshes of the DRAM die are controlled via refresh commands issued by a local DRAM die controller integrated into the DRAM die itself. The refresh rate at which refresh commands are issued by the integrated DRAM die controller may be a proprietary low refresh rate specified by the vendor of the DRAM die that uses less power than the DRAM specification-defined refresh rate for use in controller-managed refresh mode (for DRAMs produced by any vendor). Establishment of the refresh rate for self-refresh mode may be based on a power screening and a temperature for optimized power usage of the DRAM die, in an example. PASR mode is a low-power extension of self-refresh mode whereby certain portions of the DRAM die operate in accordance with self-refresh mode, while refreshes to particular portions of the DRAM die are turned off altogether to save power. The non-refreshed portion of the DRAM die will lose their contents over time.

FIG. 1 illustrates a DRAM system 100 in accordance with an embodiment of the disclosure. Referring to FIG. 1, the DRAM system 100 includes an SOC 150 including at least one processor 110 coupled to a set of subsystems 115 (e.g., modem, graphics, etc.) and a DDR controller 120 (e.g., a DDR controller) via an SOC internal bus 125. The DRAM system 100 further includes a DRAM die 125 that includes a memory 130 (e.g., memory banks, sub-banks, cells, rows of cells, etc.) and an integrated DRAM die controller 135. While one example DRAM die is depicted in FIG. 1, it will be appreciated that the DRAM system 100 may include any number of DRAM dies in other embodiments.

Referring to FIG. 1, the DDR controller 120 interacts with the DRAM die 125 using a CLK/CA (command/address) bus 140, and data is transferred via DQ and DQS (data strobe) 145. For example, the CLK/CA bus 140 may be used to issue refresh commands to particular portions of the memory 130 during the controller-managed refresh mode, or to transition the DRAM die 125 between self-refresh mode, controller-managed refresh mode and PASR mode. Moreover, as will be described in more detail with respect to FIGS. 6-10C, the DRAM die 125 may further be transitioned into a hybrid refresh mode whereby an active portion of the memory 130 is placed into the controller-managed refresh mode while an inactive portion of the memory 130 is placed into the self-refresh mode.

Figure 2A:
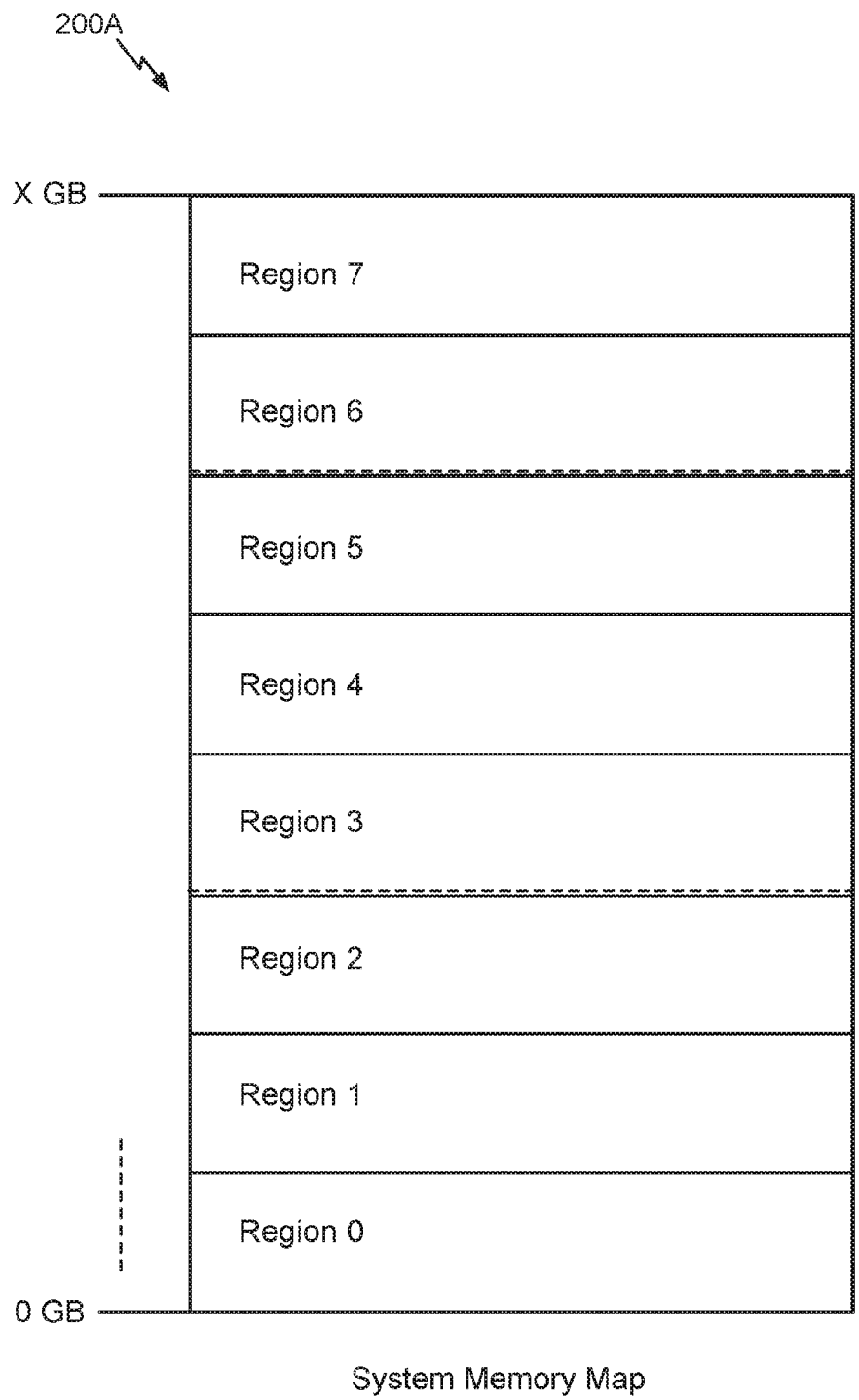
FIG. 2A illustrates a system memory map of a memory in accordance with an embodiment of the disclosure.

FIG. 2A illustrates a system memory map 200A of the memory 130 in accordance with an embodiment of the disclosure. Referring to FIG. 2A, the memory 130 is divided into eight (8) distinct regions denoted as regions 0 . . . 7. Collectively, the regions 0 . . . 7 correspond to certain amount of DRAM memory (e.g., X GB of memory). Each of the regions 0 . . . 7 corresponds to a defined grouping of memory components, such as memory banks, sub-banks, rows of cells and/or cells. The memory components of each of the regions 0 . . . 7 are non-overlapping with respect to the memory components of each other region.

Figure 2B:
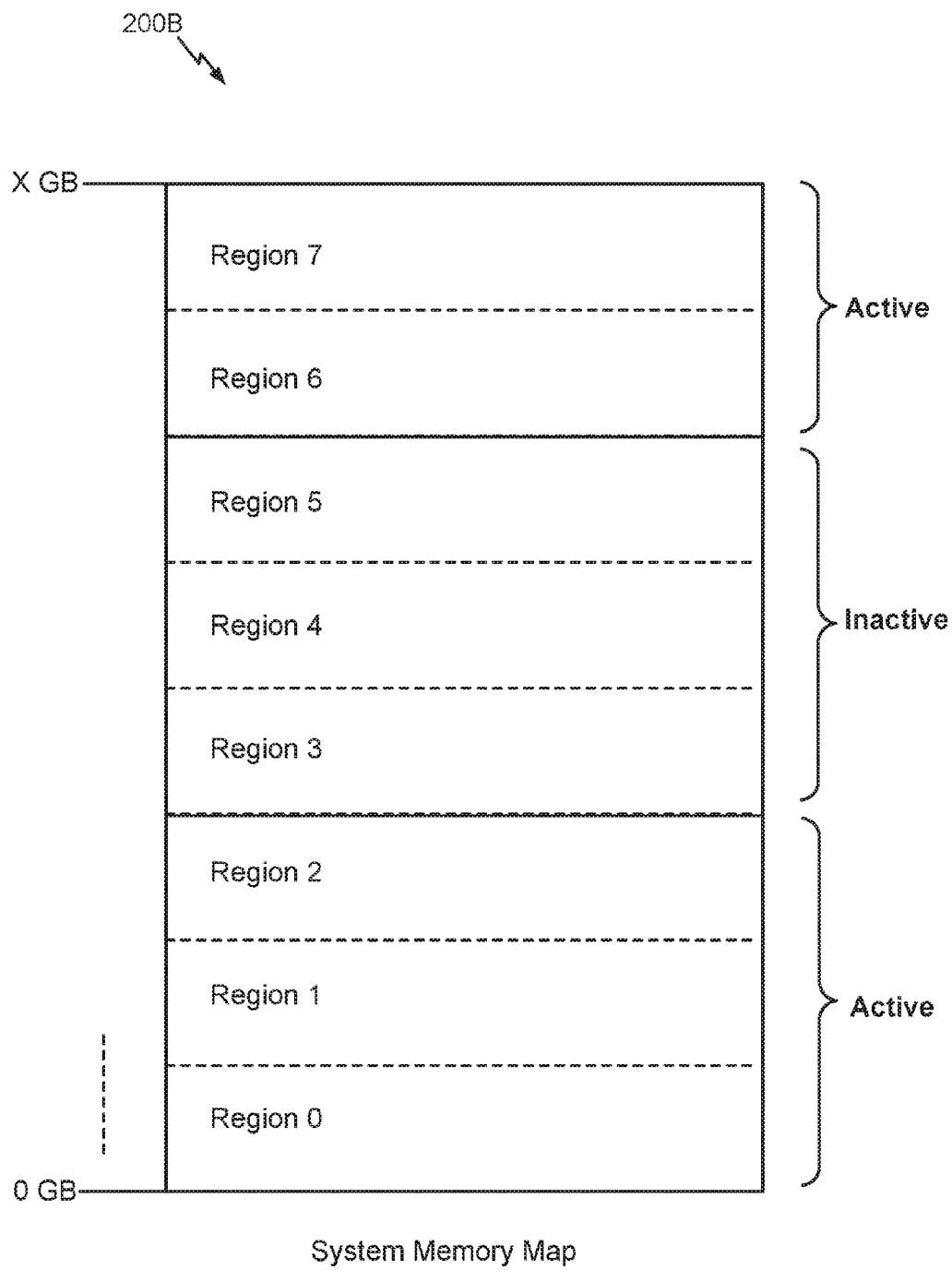
FIG. 2B illustrates a system memory map in accordance with another embodiment of the disclosure.

FIG. 2B illustrates a system memory map 200B, which is an example implementation of the system memory map 200A of FIG. 2A in accordance with an embodiment of the disclosure. Referring to FIG. 2B, certain regions may be characterized as "active" while other regions are characterized as "inactive". As used herein, a region is deemed active if data within the region is currently in demand by the DRAM system. One example of a region that is "active" in this context is where the region is currently executing a memory access operation (e.g., a read command, a write command, etc.) in at least one of its memory cells. Likewise, a region is deemed inactive if data within the region is not currently in demand by the DRAM system. One example of a region that is "inactive" in this context is where the region is not currently executing a memory access operation in any of its memory cells. The system memory map 200B of FIG. 2B illustrates a particular example whereby regions 0 . . . 2 and 6 . . . 7 are active, while regions 3 . . . 5 are inactive. The active and inactive regions depicted in FIG. 2B may also be referred to as active or inactive portions of an associated DRAM die.

The determination of individual regions as being active or inactive can occur, as an example, via the use of timers. For example, the DDR controller 120 may use a timer to determine an elapsed time from a previous memory access to a region. When the timer expires with no new memory access requests (e.g., read or write requests) to the region, the region can be marked as inactive. The region can then transition back to "active" when the next memory access request is issued thereto, at which point the timer is restarted, and so on. In an example, if the DDR Controller 120 is tracking the activity statuses for N regions, then N inactivity timers can be used (e.g., one per region) to independently track the activity status of each respective region.

In the example noted above, the DDR controller 120 ultimately learns which regions are active and which regions are inactive. Accordingly, even if other components are involved with the active or inactive status determination for particular memory regions, the DDR controller 120 directly (or indirectly) determines the active or inactive status of the various regions, and uses this information to control the refresh mode of the DRAM die, as will be explained in more detail below.

Figure 3:
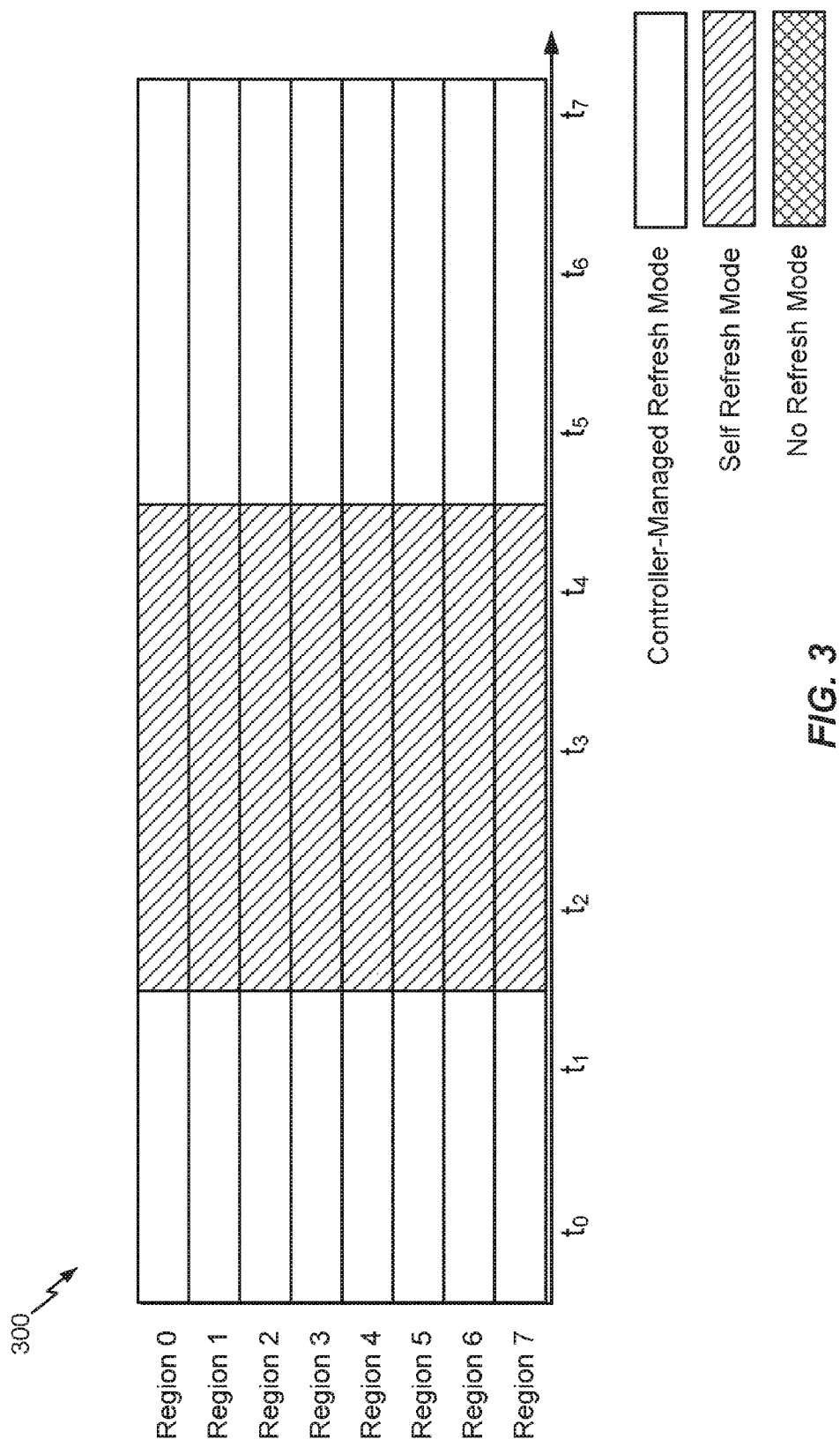
FIG. 3 illustrates a refresh mode chart that depicts a manner by which the refresh modes of regions 0 . . . 7 of in the memory of FIG. 2A change over time.

FIG. 3 illustrates a refresh mode chart 300 that depicts a manner by which the refresh modes of the regions 0 . . . 7 of FIG. 2A change over time. Referring to FIG. 3, each of regions 0 . . . 7 is configured for operation in accordance with controller-managed refresh mode or self-refresh mode. Specifically, regions 0 . . . 7 operate in the controller-managed refresh mode during $t_0$ and $t_1$ (e.g., while one or more of regions 0 . . . 7 is active). After $t_1$, the regions 0 . . . 7 switch to self-refresh mode (e.g., in response to each of regions 0 . . . 7 being inactive). The regions 0 . . . 7 remain in self-refresh mode during $t_2$, $t_3$ and $t_4$. After $t_4$, the regions 0 . . . 7 switch back to controller-managed refresh mode (e.g., in response to one or more of regions 0 . . . 7 becoming active). The regions 0 . . . 7 remain in controller-managed refresh mode during $t_5$, $t_6$ and $t_7$.

Figure 4:
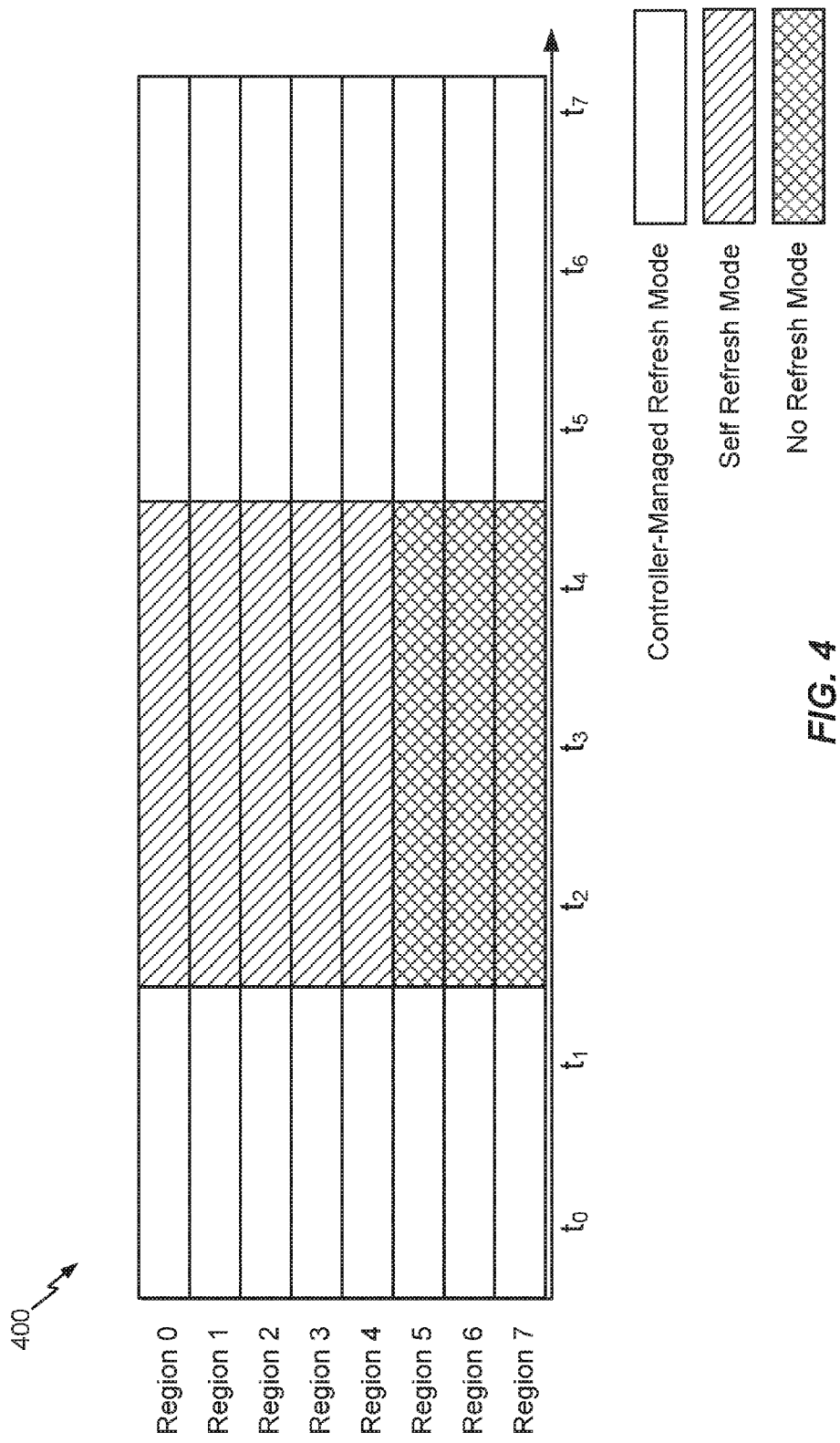
FIG. 4 illustrates a refresh mode chart that depicts another manner by which the refresh modes of the regions 0 . . . 7 in the memory of FIG. 2A change over time.

FIG. 4 illustrates a refresh mode chart 400 that depicts another manner by which the refresh modes of the regions 0 . . . 7 of FIG. 2A change over time. Referring to FIG. 4, each of regions 0 . . . 7 is configured for operation in accordance with controller-managed refresh mode or PASR mode. Specifically, regions 0 . . . 7 operate in the controller-managed refresh mode during $t_0$ and $t_1$ (e.g., while one or more of regions 0 . . . 7 is active). After $t_1$, the regions 0 . . . 7 switch to PASR mode (e.g., in response to each of regions 0 . . . 7 being inactive). In the PASR mode example depicted in FIG. 4, regions 0 . . . 4 enter self-refresh mode while regions 5 . . . 7 enter no refresh mode. This means that regions 5 . . . 7 are not refreshed, and any data stored therein will eventually be lost. The regions 0 . . . 7 remain in PASR mode during $t_2$, $t_3$ and $t_4$. After $t_4$, the regions 0 . . . 7 switch to back to controller-managed refresh mode (e.g., in response to one or more of regions 0 . . . 7 becoming active). The regions 0 . . . 7 remain in PASR mode during $t_5$, $t_6$ and $t_7$.

Figure 5A:
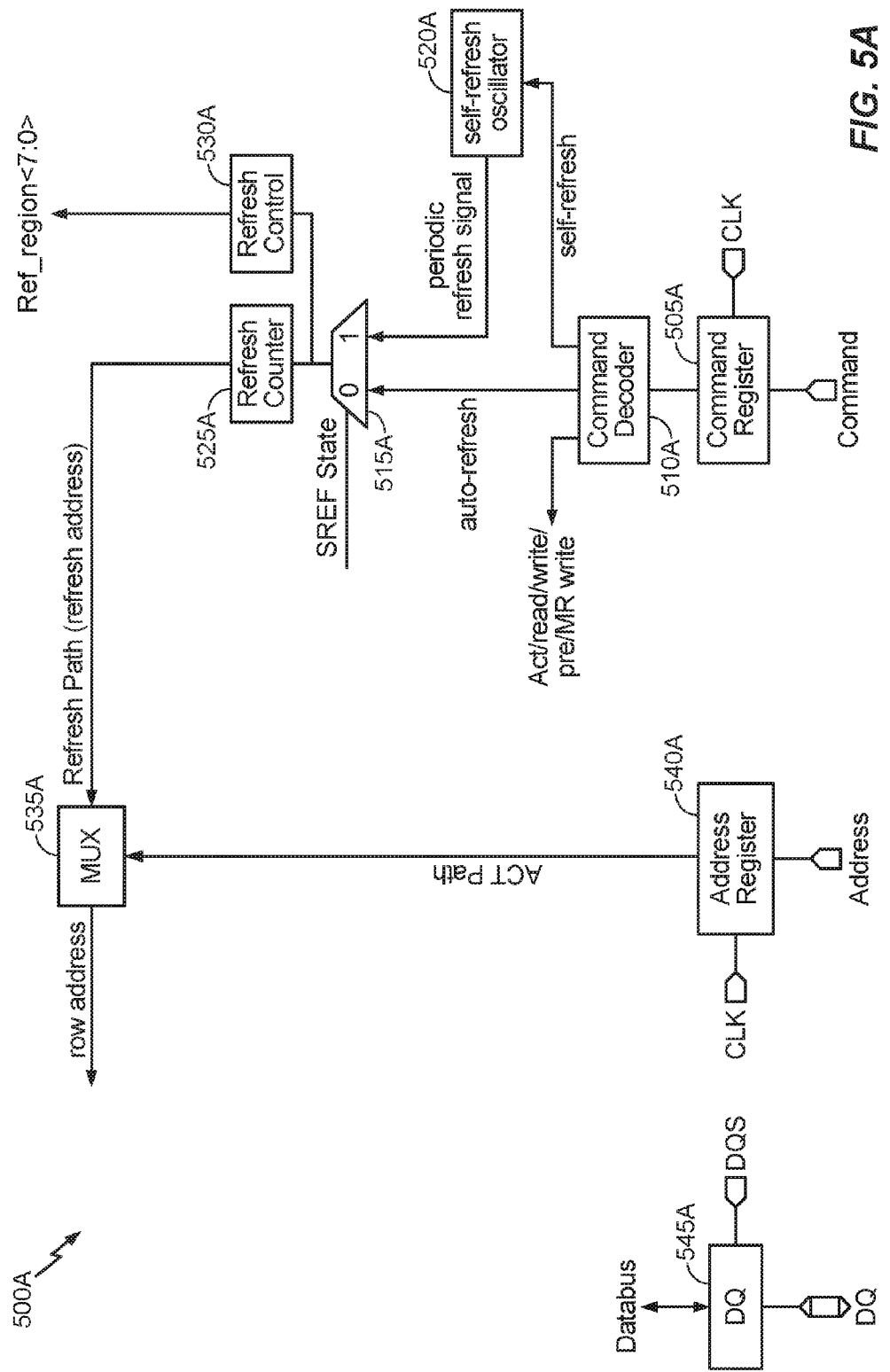
FIGS. 5A-5C collectively illustrate logical portions of a DRAM die configuration.
Figure 5B:
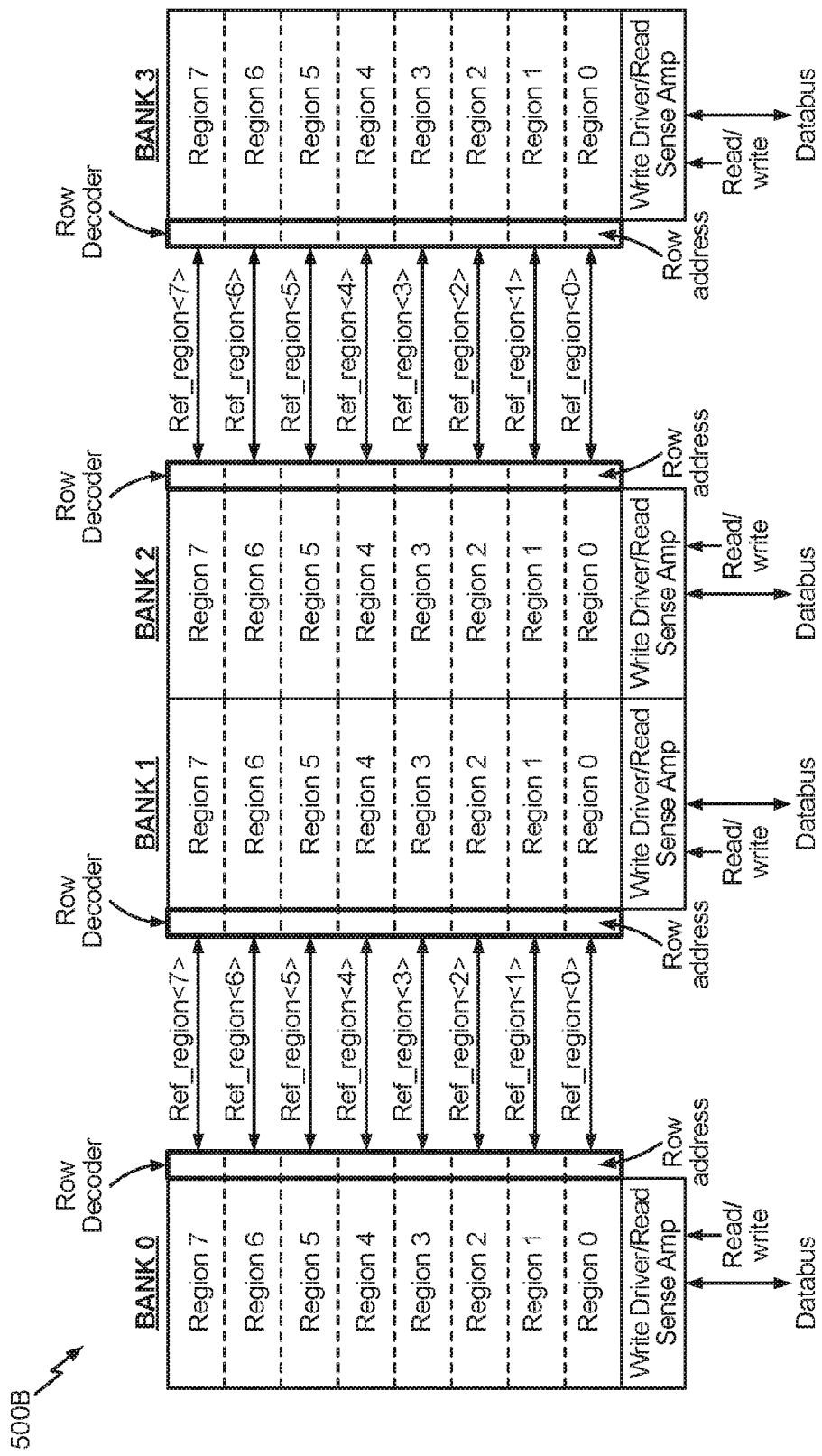
Figure 5C:
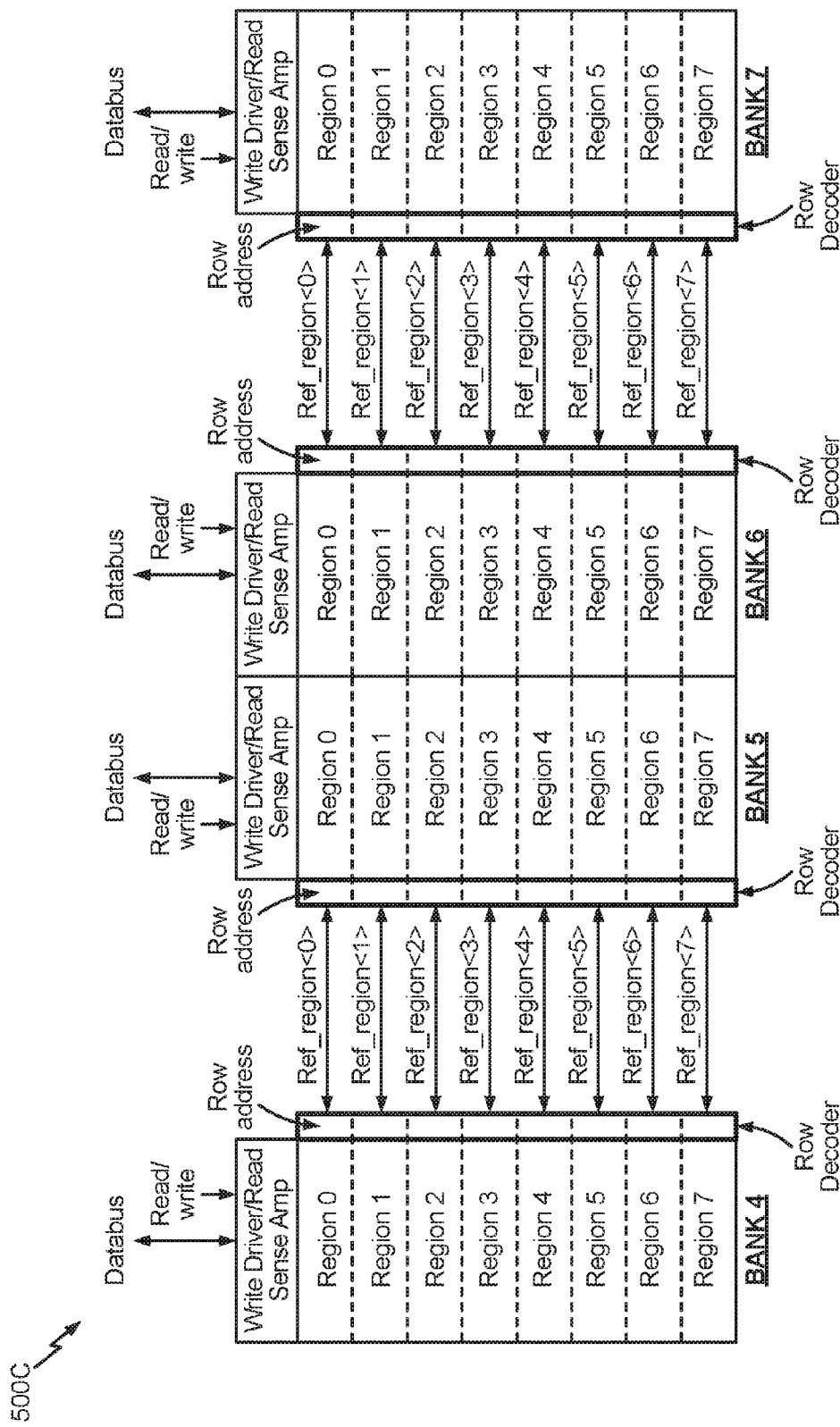

FIGS. 5A-5C collectively illustrate logical portions of a DRAM die configuration. More specifically, FIG. 5A illustrates a DRAM die controller configuration 500A, while FIGS. 5B and 5C illustrate DRAM die memory configurations 500B-500C. The DRAM die configuration depicted in FIGS. 5A-5C may be used to implement the refresh mode transitions depicted in the refresh mode chart 300 of FIG. 3.

Referring to FIG. 5A, the DRAM die controller configuration 500A includes a command register 505A with clock (CLK) and Command inputs, and a command decoder 510A that outputs memory commands (e.g., Act, read, write, pre, MR or write/read command, etc.), auto-refresh commands (or controller-managed refresh commands) to a refresh selector 515A, or a self-refresh command to self-refresh oscillator 520A. The self-refresh oscillator 520A outputs self-periodic refresh signals to the refresh selector 515A when the DRAM die is in self-refresh mode. The refresh selector 515A selects between the auto-refresh and periodic self-refresh signal based on a self-refresh (SREF) State input that controls whether the DRAM die is operating in self-refresh mode or controller-managed refresh mode. The refresh selector 515A directs a refresh counter 525A to be incremented (e.g., to a next memory address for a refresh) and a refresh control 530A to implement a refresh on target memory components (e.g., memory banks, sub-banks, specific cells, etc.) that correspond to one of regions 0 . . . 7. The arrangement of the refresh selector 515A, the refresh counter 525A and the refresh control 530A is not region-specific, but rather is configured to control refreshes issued to each region under control (e.g., each of regions 0 . . . 7.

A multiplexer 535A receives the incremented refresh counter as a refresh address, and also receives an address from an address register 540A with CLK and an Address as inputs. The multiplexer 535 switches between a Refresh path (e.g., refresh addresses received from the refresh counter 525A) and an ACT path from the address register 540A. For any refresh operation (e.g., self-refresh mode or controller-managed refresh mode), the multiplexer 535A will select the input from the Refresh path. If there is no refresh taking place, the multiplexer 535A will select the row address from the ACT path to be used for ACT (e.g., where ACT denotes activation of a DRAM page or row). The DRAM die controller configuration 500A further includes a data strobe DQ 545A connected to a databus with DQ and DQS as inputs. The DQ 545A is configured to transfer data to/from various memory banks as depicted in FIGS. 5B-5C.

Referring to FIG. 5B, the DRAM die memory configuration 500B includes memory banks 0 . . . 3 that each include portions of memory allocated to one of regions 0 . . . 7. Each of memory banks 0 . . . 3 includes a respective row, a respective write driver/read sense amplifier, and a respective databus configured to receive memory commands (e.g., read/write commands, etc.) from the command decoder 510A. The ref_region 0 . . . 7 controls sent by 530A go to the same corresponding region in each of the memory banks 0 . . . 3.

Referring to FIG. 5C, the DRAM die memory configuration 500C is deployed as part of the DRAM die along with the DRAM die memory configuration 500B of FIG. 5B. Similar to the DRAM die memory configuration 500B of FIG. 5B, the DRAM die memory configuration 500C includes 4 memory banks denoted as memory banks 4 . . . 7 (for a total of 8 memory between the DRAM die memory configurations 500B of FIG. 5B and 500C of FIG. 5C) that each include portions of memory allocated to one of regions 0 . . . 7. Each of memory banks 0 . . . 3 includes a respective row decoder, a respective write driver/read sense amplifier, and a respective databus configured to receive memory commands (e.g., read/write commands, etc.) from the command decoder 510A. The ref_region 0 . . . 7 controls sent by 530A go to the same corresponding region in each of the memory banks 4 . . . 7.

The DRAM die configuration depicted in FIGS. 5A-5C commonly controls each memory region (e.g., regions 0 . . . 7 of the DRAM die using the refresh counter 525A, refresh control 530A and SREF/AREF multiplexer 535A. This does not permit the individual regions to be in different refresh modes (e.g., controller-managed refresh mode and self-refresh mode) at the same time.

Figure 5D:
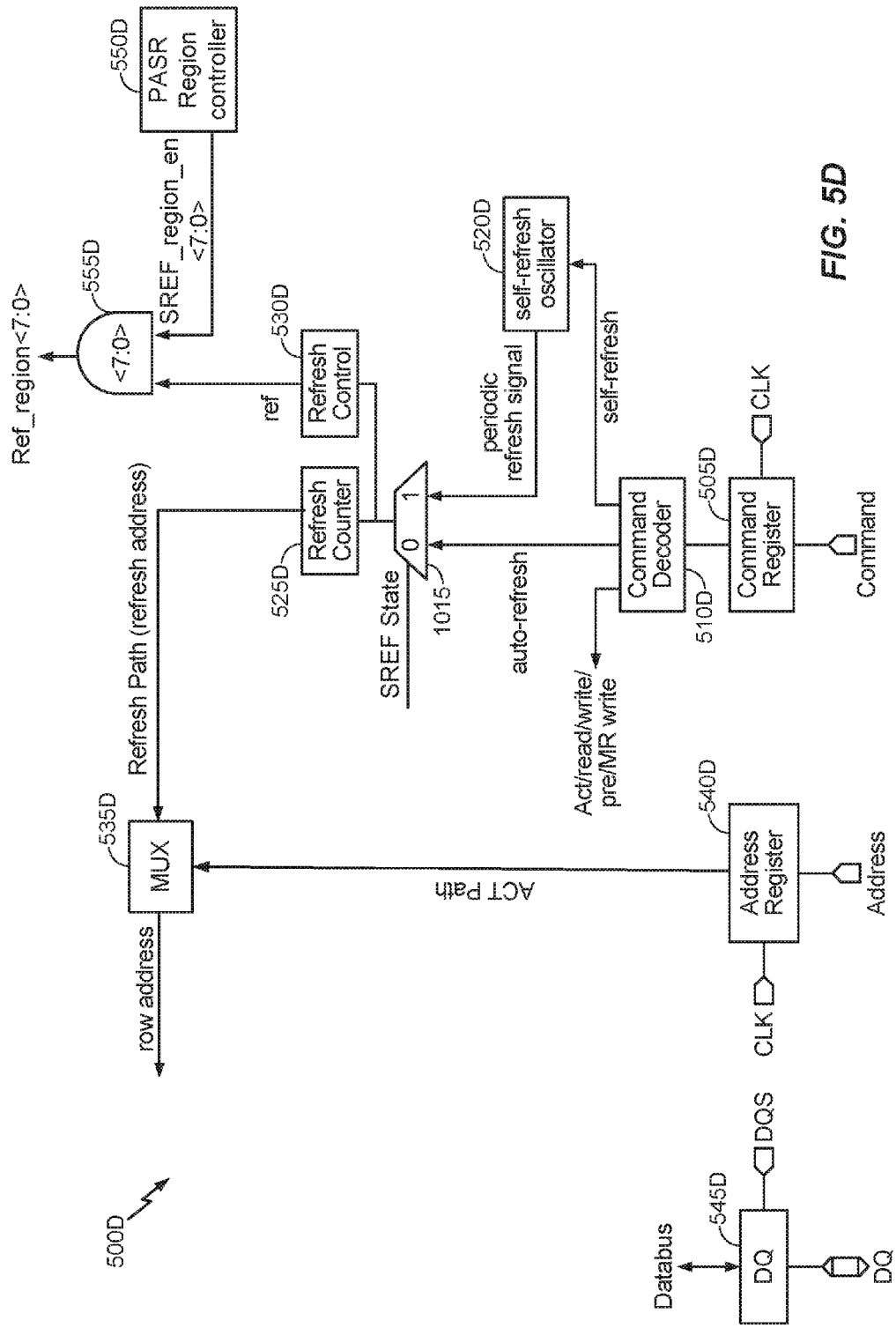
FIG. 5D illustrates a DRAM die controller configuration, which is an alternative to the DRAM die controller configuration described above with respect to FIG. 5A.

FIG. 5D illustrates a DRAM die controller configuration 500D, which is an alternative to the DRAM die controller configuration 500A described above with respect to FIG. 5A. The DRAM die controller configuration 500D may be deployed in conjunction with the DRAM die memory configurations 500B-500C described above with respect to FIGS. 5B-5C, so further illustration and description of the DRAM die memory configurations 500B-500C has been omitted for the sake of brevity. The DRAM die configuration depicted in FIG. 5D in association with FIGS. 5B-5C may be used to implement the refresh mode transitions depicted in the refresh mode chart 400 of FIG. 4. In particular, support for PASR capability (or no-refresh mode for certain memory regions is depicted in FIG. 5D)

Referring to FIG. 5D, components 505D to 545D substantially correspond to components 505A to 545A of FIG. 5A, respectively, and as such will not be described further for the sake of brevity. The DRAM die controller configuration 500D further includes a PASR region control 550D, which is configured to output a signal (SREF_region_en<7:0>) that specifies the particular regions for self-refresh mode or no-refresh mode. The outputs of the refresh control 530D and the PASR region control 550D are input to a self-refresh control circuit 555D. The self-refresh control circuit 555D in turn outputs the self-refresh command to the appropriate region(s), while refraining from issuing any refresh commands to regions that are designated for the no-refresh mode.

The DRAM die configurations depicted in FIGS. 5A-5D commonly controls each memory region (e.g., regions 0 . . . 7 of the DRAM die using the refresh counter 525A, refresh control 530A and SREF/AREF multiplexer 535A of FIG. 5A or the refresh counter 525D, refresh control 530D and SREF/AREF multiplexer 535D of FIG. 5D. This does not permit the individual regions to be in controller-managed refresh mode and self-refresh mode at the same time.

Embodiments of the disclosure which are described below with respect to FIGS. 6-11 relate to a DRAM die configured to individually control regions so that certain regions can operate in self-refresh mode while other regions operate in controller-managed refresh mode.

Figure 6:
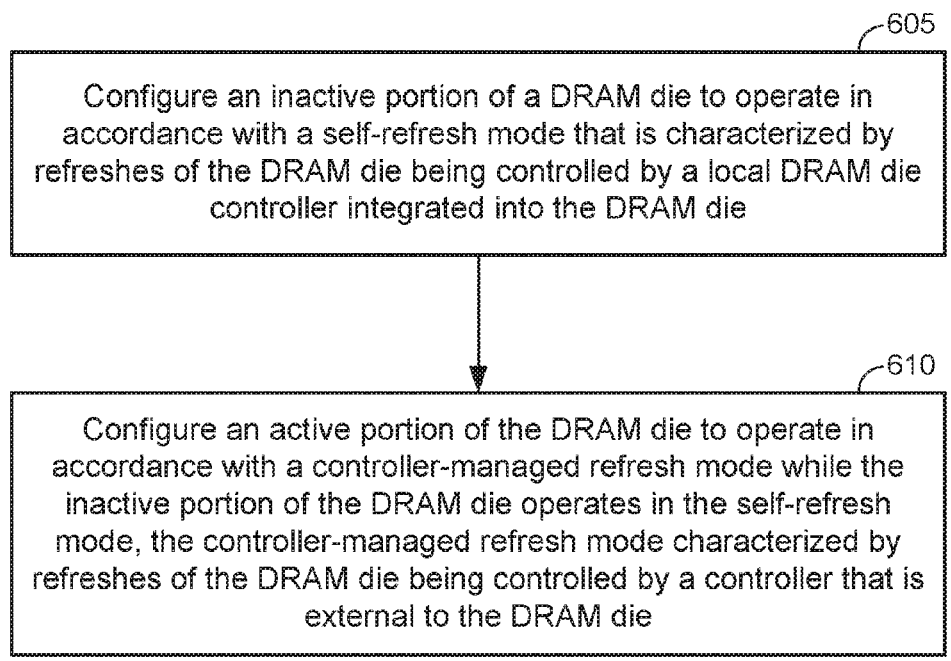
FIG. 6 illustrates a process of performing refresh operations within a DRAM system in accordance with an embodiment of the disclosure.

FIG. 6 illustrates a process of performing refresh operations within a DRAM system in accordance with an embodiment of the disclosure. In an example, the process of FIG. 6 may be implemented with respect to the DRAM system 100 of FIG. 1 in an example.

Referring to FIG. 6, the DRAM system configures an inactive portion of a DRAM die to operate in accordance with a self-refresh mode that is characterized by refreshes of the DRAM die being controlled by a local DRAM die controller (e.g., the integrated DRAM die controller 135 of FIG. 1) integrated into the DRAM die, 605. Further, the DRAM system also configures the active portion of the DRAM die to operate in accordance with a controller-managed refresh mode while the inactive portion of the DRAM die operates in the self-refresh mode, the controller-managed refresh mode characterized by refreshes of the DRAM die being controlled by a controller that is external to the DRAM die, 610. Examples that explain how the different portions (or regions) can be configured in the different refresh modes will be provided below in more detail.

Referring to FIG. 6, in an example, 605-610 can be triggered in response to a determination of the active and inactive portions. In this scenario, the DRAM system determines an active portion of a DRAM die and an inactive portion of the DRAM die (e.g., based on region-specific timers as described above), which may then trigger the refresh mode configurations implemented at 605-610.

Figure 7A:
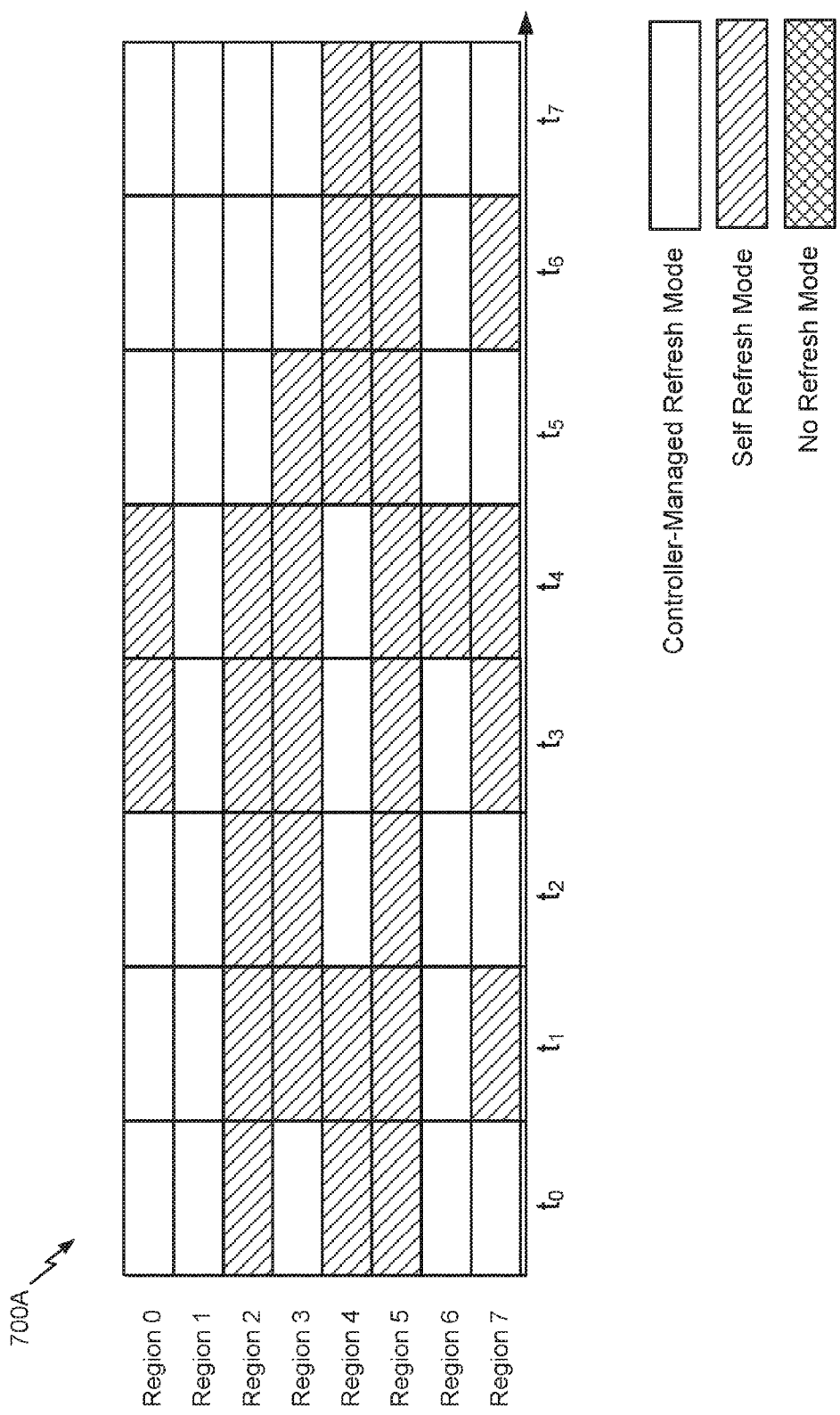
FIG. 7A illustrates a refresh mode chart 700A that depicts a manner by which the refresh modes of the regions 0 . . . 7 in the memory of FIG. 2A change over time in accordance with an example implementation of the process of FIG. 6.

FIG. 7A illustrates a refresh mode chart 700A that depicts a manner by which the refresh modes of the regions 0 . . . 7 of FIG. 2A change over time in accordance with an example implementation of the process of FIG. 6. Referring to FIG. 7A, each of regions 0 . . . 7 is configured for operation in accordance with controller-managed refresh mode or self-refresh mode. In contrast to the refresh mode charts 300-400 described above with respect to FIGS. 3-4, each of regions 0 . . . 7 can be individually controlled in terms of refresh mode at the same time. The refresh mode chart 700A of FIG. 7A thereby depicts a particular example whereby the active and inactive statuses of the regions 0 . . . 7 are as follows:

TABLE 1

Active/Inactive Status Table [Inactive = 0; Active = 1]

| | $t_0$ | $t_1$ | $t_2$ | $t_3$ | $t_4$ | $t_5$ | $t_6$ | $t_7$ |
|---|---|---|---|---|---|---|---|---|
| Region 0 | 1 | 1 | 1 | 0 | 0 | 1 | 1 | 1 |
| Region 1 | 1 | 1 | 1 | 1 | 1 | 1 | 1 | 1 |
| Region 2 | 0 | 0 | 0 | 0 | 0 | 1 | 1 | 1 |
| Region 3 | 1 | 0 | 0 | 0 | 0 | 0 | 1 | 1 |
| Region 4 | 0 | 0 | 1 | 1 | 1 | 0 | 0 | 0 |
| Region 5 | 0 | 0 | 0 | 0 | 0 | 0 | 0 | 0 |
| Region 6 | 1 | 1 | 1 | 1 | 0 | 1 | 1 | 1 |
| Region 7 | 1 | 0 | 1 | 0 | 0 | 1 | 0 | 1 |

By way of example, $t_5$ of table 1 (above) represents an example of the active/inactive state for regions 0 . . . 7 that is depicted in the system memory map 200B of FIG. 2B, whereby regions 0 . . . 2 and 6 . . . 7 are active while regions 3 . . . 5 are inactive.

Figure 7B:
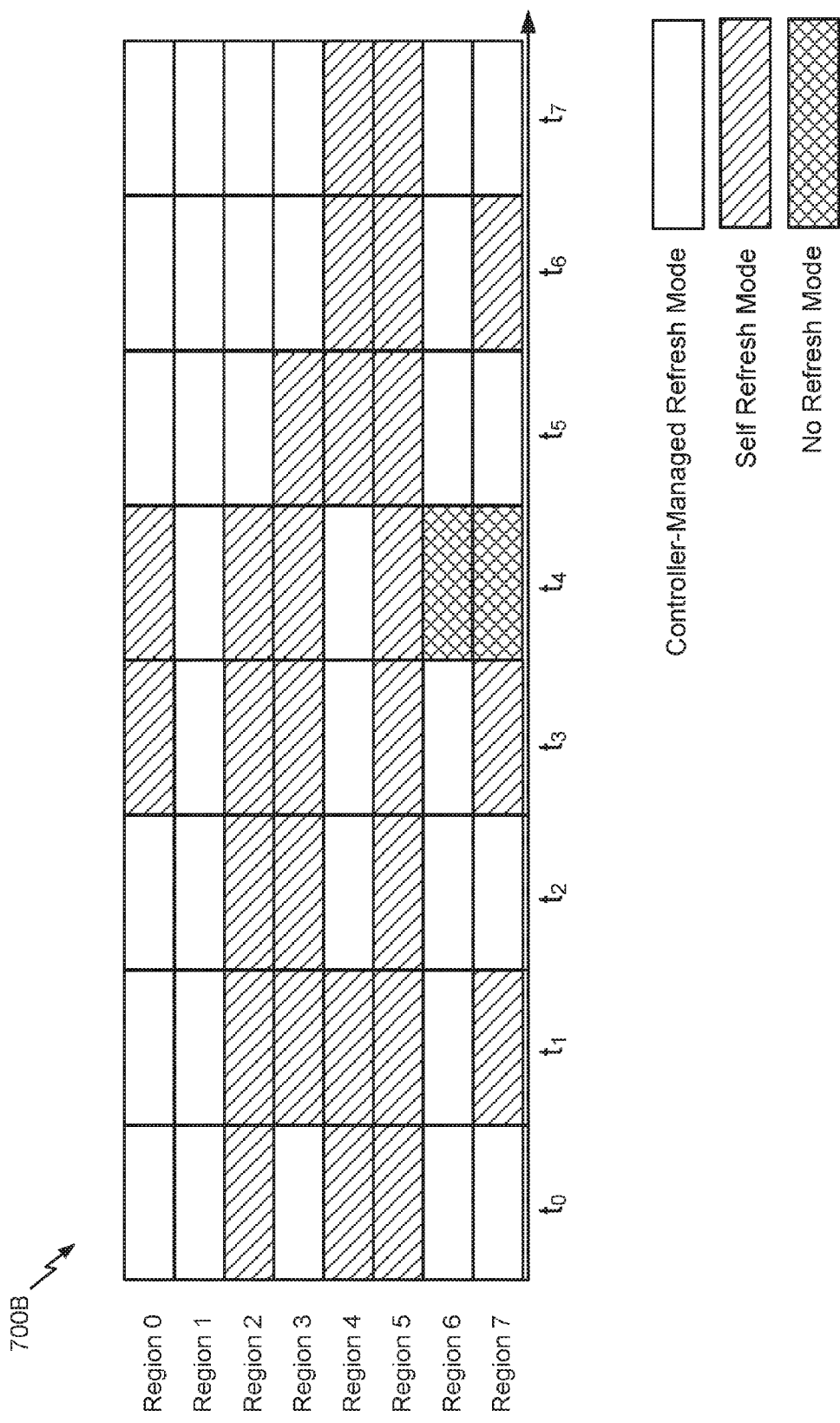
FIG. 7B illustrates a refresh mode chart 700B that depicts a manner by which the refresh modes of the regions 0 . . . 7 in the memory of FIG. 2A change over time in accordance with another example implementation of the process of FIG. 6.

FIG. 7B illustrates a refresh mode chart 700B that depicts a manner by which the refresh modes of the regions 0 . . . 7 of FIG. 2A change over time in accordance with another example implementation of the process of FIG. 6. Referring to FIG. 7B, each of regions 0 . . . 7 is configured for operation in accordance with controller-managed refresh mode or self-refresh mode. Similar to FIG. 7A, in contrast to the refresh mode charts 300-400 described above with respect to FIGS. 3-4, each of regions 0 . . . 7 can be individually control in terms of refresh mode at the same time. The refresh mode chart 700B is identical to the refresh mode chart 700A of FIG. 7A, except that certain inactive regions are transitioned to no-refresh mode (as in PASR) instead of self-refresh mode. The refresh mode chart 700B of FIG. 7B thereby depicts a particular example whereby the active and inactive statuses of the regions 0 . . . 7 are arranged as described above with respect to Table 1. By way of example, $t_4$ in the refresh mode chart 700B shows regions 6 and 7 entering into no-refresh mode. Accordingly, the inactive portion of the DRAM die that is set to the self-refresh mode need not correspond to all inactive regions in the DRAM die, as some of the inactive regions could instead be set to operate in accordance with the no-refresh mode at certain times.

As will be appreciated, selectively configuring certain inactive regions to operate in self-refresh mode leverages the power savings of self-refresh when only a subset of the memory of the DRAM die is being accessed. The active portion (or regions) that use the controller-managed refresh mode may be used for normal memory controller access (e.g., double data rate (DDR) memory access). In this arrangement, refreshes of the active memory space of the DRAM system are managed by an 'external' controller (e.g., DDR controller 120) relative to the DRAM die, while refreshes of the inactive memory space of the DRAM system are managed via self-refresh by the integrated DRAM die controller. As noted above, self-refreshes use a lower refresh current to enable small processes to run for extended amounts of time on a low power budget. This mixed refresh scheme may be distinguished from PASR because PASR achieves power savings at the expense of losing the actual data that is stored in the portions of the memory that are not refreshed. Also, during PASR, other operations (e.g., memory controller access) are not allowed. That is, the memory goes to sleep.

Figure 8:
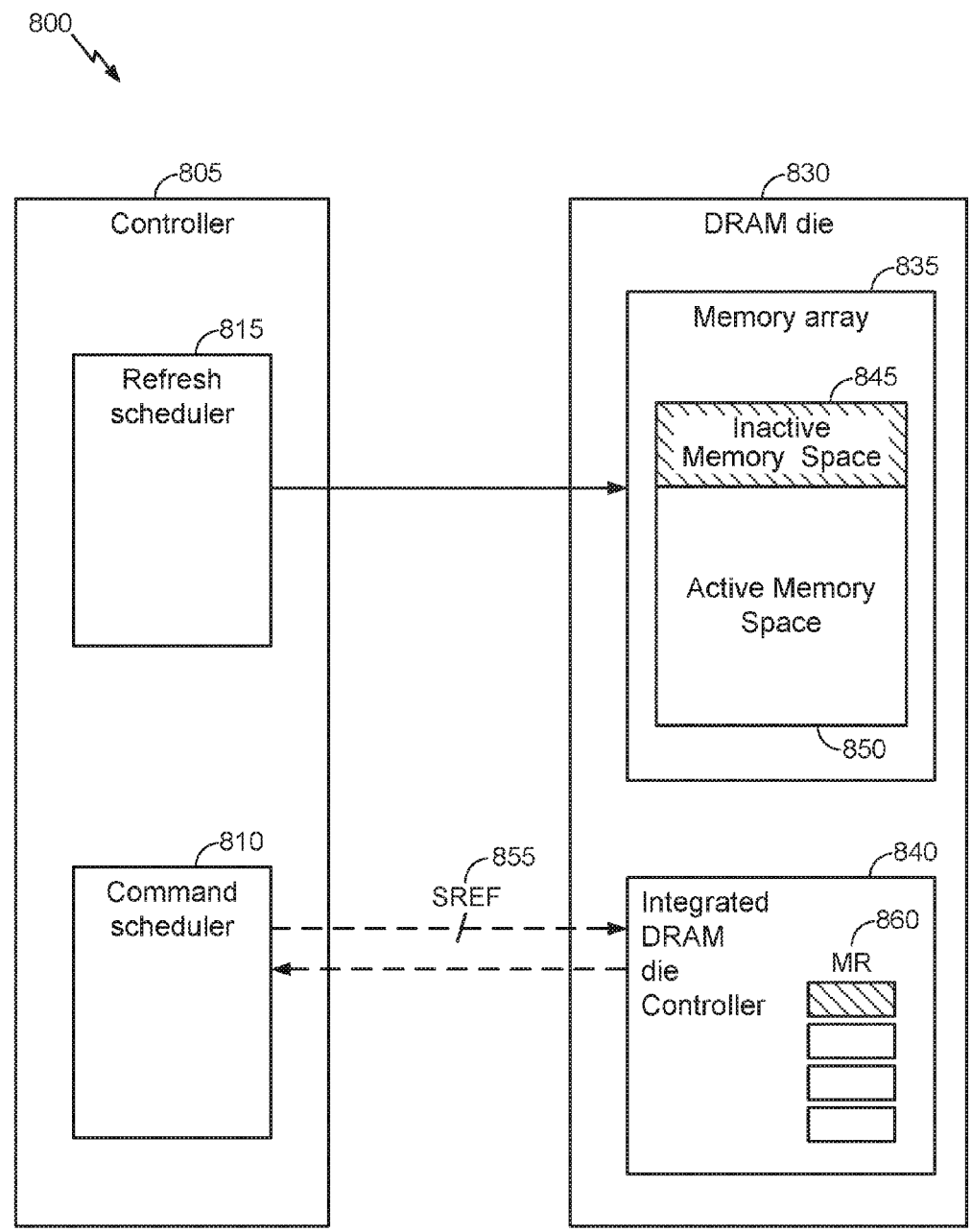
FIG. 8 illustrates a DRAM system in accordance with an embodiment of the disclosure.

FIG. 8 illustrates a DRAM system 800 in accordance with an embodiment of the disclosure. The DRAM system 800 represents an example implementation of the DRAM system 100 described above with respect to FIG. 1.

Referring to FIG. 8, the DRAM system 800 includes a controller 805 (e.g., DDR controller 120 of FIG. 1, such as a DDR controller) and a DRAM die 830. The controller 805 includes a command scheduler 810 and a refresh scheduler 815 that leverages the power savings of self-refresh when the controller 805 uses only a subset of DRAM memory, according to aspects of the present disclosure. In this configuration, the controller 805 is coupled to the DRAM die 830, whereby the DRAM die 830 includes a memory array 835 (e.g., memory 130 of FIG. 1) and an integrated DRAM die controller 840 (e.g., integrated DRAM die controller 135 of FIG. 1). The refresh scheduler 815 issues refresh operations. In this aspect of the disclosure, an inactive memory space 845 of the DRAM die 830 enters a self-refresh mode in response to a self-refresh command (SREF) or a SREF command 855. In addition, a remaining portion of active memory space 850 of the DRAM die 830 is maintained in the controller-managed refresh mode (i.e., controlled via refresh commands from the refresh scheduled 815 of the controller 805).

Referring to FIG. 8, the DRAM die 830 includes the integrated DRAM die controller 840 with mode registers 860. In this configuration, the DRAM die 830 enters a self-refresh mode for a portion of the memory banks or a sub-bank of the memory of an inactive memory space 845. In addition, a remaining portion of the memory is maintained by the refresh scheduler 815 as an active memory space 850 to support access from the controller 805, while the inactive memory space 835 operates in the self-refresh mode according to self-refresh logic of the integrated DRAM die controller 840. In this configuration, the command scheduler 810 issues an SREF command 855 to define operation by the DRAM die 830 according to the self-refresh mode.

Referring to FIG. 8, the SREF command 855 may divide the inactive memory space 845 (e.g., a half/quarter/eighth) of the DRAM die 830 by programming the mode registers 860. The mode registers 860 (or a mode register) may be programmed to enable/disable SREF operation as well as to define the inactive memory space 845, and the remaining portion (e.g., sub-banks) of the DRAM die 830 to provide the active memory space 850 for normal access (e.g., DDR memory access) by the controller 805. Periodic refresh of the active memory space 850 of the DRAM die 830 may be managed by the refresh scheduler 815 of the controller 805, while periodic self-refresh of the inactive memory space 845 is managed by the self-refresh logic of the integrated DRAM die controller 840.

Figure 9:
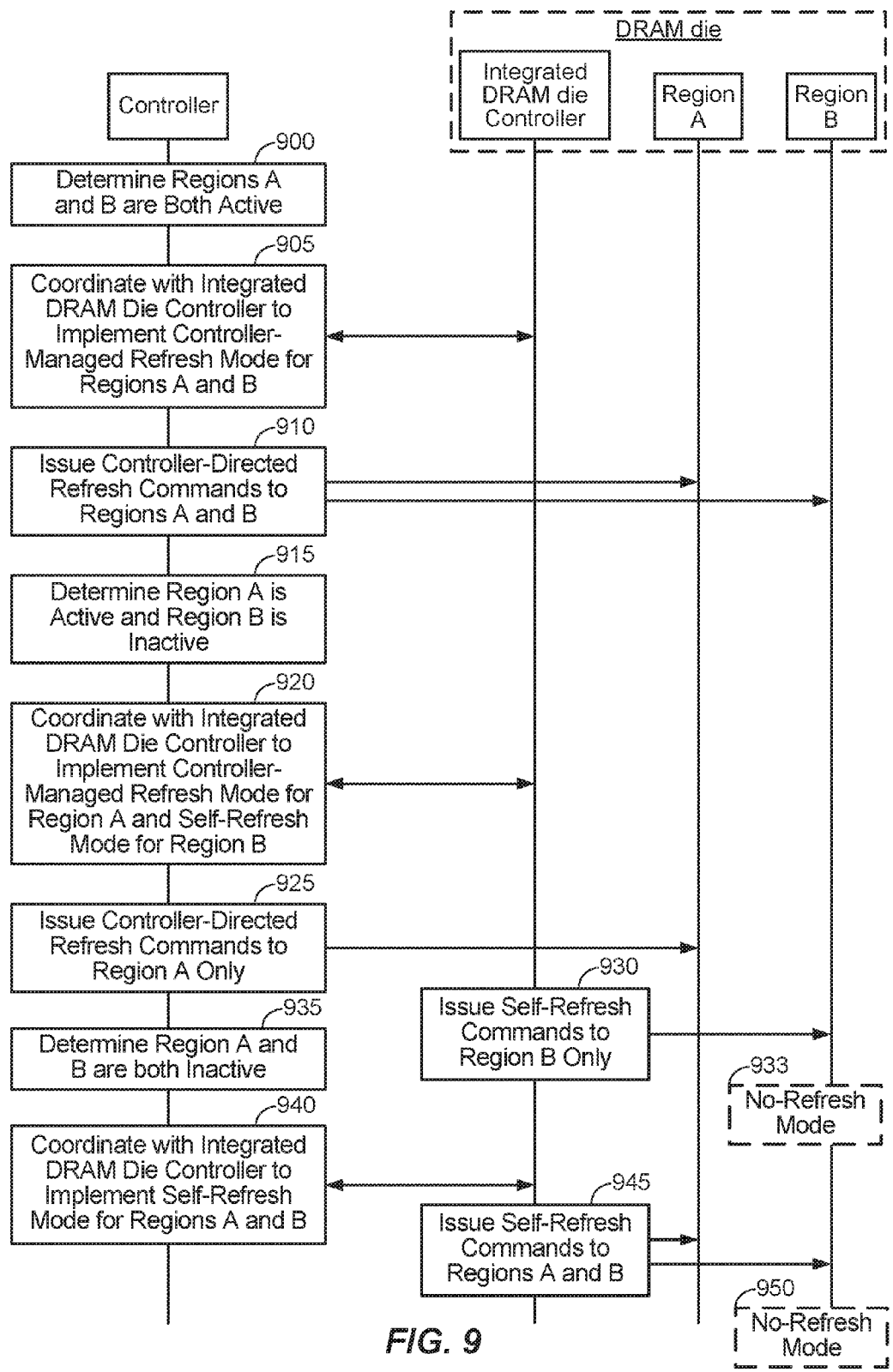
FIG. 9 illustrates an example implementation of the process of FIG. 6 in accordance with an embodiment of the disclosure.

FIG. 9 illustrates an example implementation of the process of FIG. 6 in accordance with an embodiment of the disclosure. Referring to FIG. 9, a controller (e.g., controller 105 of FIG. 1 or controller 805 of FIG. 8) is coupled to a DRAM die (e.g., DRAM die 125 of FIG. 1 or DRAM die 830 of FIG. 8) that includes an integrated DRAM die controller (e.g., integrated DRAM die controller 135 of FIG. 1 or integrated DRAM die controller 840 of FIG. 8) and at least two memory regions denoted as region A and region B. In an example, regions A and B may correspond to different groupings of regions 0 . . . 7 from FIG. 2A-4 or 7, or to different portions of the memory array 835 of FIG. 8.

Referring to FIG. 9, the controller determines that regions A and B of the DRAM die are both active, 900. As discussed above, in an example, the DDR controller 120 may use a set of timers (e.g., one for region A and one for region B, etc.) to determine an elapsed time from a previous memory access to a region, with a region marked inactive after timer expiration without a memory access request. Based on the active determination of 900, the controller coordinates with the integrated DRAM die controller to implement the controller-managed refresh mode for regions A and B, 905. While regions A and B operate in accordance with the controller-managed refresh mode, the controller issues controller-directed refresh commands (or auto-refresh commands) to the DRAM die to be executed at controller-specified memory addresses within regions A and B, 910.

Referring to FIG. 9, the controller determines that region A is active and region B is inactive, 915. Based on the determination of 915, the controller coordinates with the integrated DRAM die controller to implement the controller-managed refresh mode for region A and the self-refresh mode for region B, 920 (e.g., as in 605-610 of FIG. 6). While region A operates in accordance with the controller-managed refresh mode, the controller issues controller-directed refresh commands (or auto-refresh commands) to the DRAM die to be executed at controller-specified memory addresses within region A, 925. While region B operates in accordance with the self-refresh mode, the integrated DRAM die controller issues self-refresh commands to be executed at specified memory addresses within region B, 930. As noted above with respect to FIG. 7B, some portion of the inactive region (in this case, region B) may optionally be transitioned into no-refresh mode instead of self-refresh mode, 933. In this case, the integrated DRAM die controller would not target the portion of Region B that is operating in the no-refresh mode with any self-refresh commands at 930.

Referring to FIG. 9, the controller determines that regions A and B are both inactive, 935. Based on the determination of 915, the controller coordinates with the integrated DRAM die controller to implement the self-refresh mode for regions A and B, 940. While regions A and B operate in accordance with the self-refresh mode, the integrated DRAM die controller issues self-refresh commands to be executed at specified memory addresses within regions A and B, 945. As noted above with respect to FIG. 7B, some portion of the inactive region (in this case, regions A and B) may optionally be transitioned into no-refresh mode instead of self-refresh mode, 950. In this case, the integrated DRAM die controller would not target the portion of regions A or B that is operating in the no-refresh mode with any self-refresh commands at 945.

Referring to FIG. 9, it will be appreciated that the states of regions A and B as being active or inactive can change over time during operation of the DRAM system. The regions A and B (and any other regions of the DRAM die) can thereby be reconfigured as necessary based upon transitions between the active and inactive states. For example, 915-930 show a reconfiguring of region B to self-refresh mode after a transition of region B from the active state to the inactive state, while 935-945 show a reconfiguring of region A to self-refresh mode after a transition of region A from the active state to the inactive state. While not shown expressly in FIG. 9, a region transitioning from the inactive state to the active state may likewise be reconfigured from the self-refresh mode to the controller-managed refresh mode.

Figure 10:
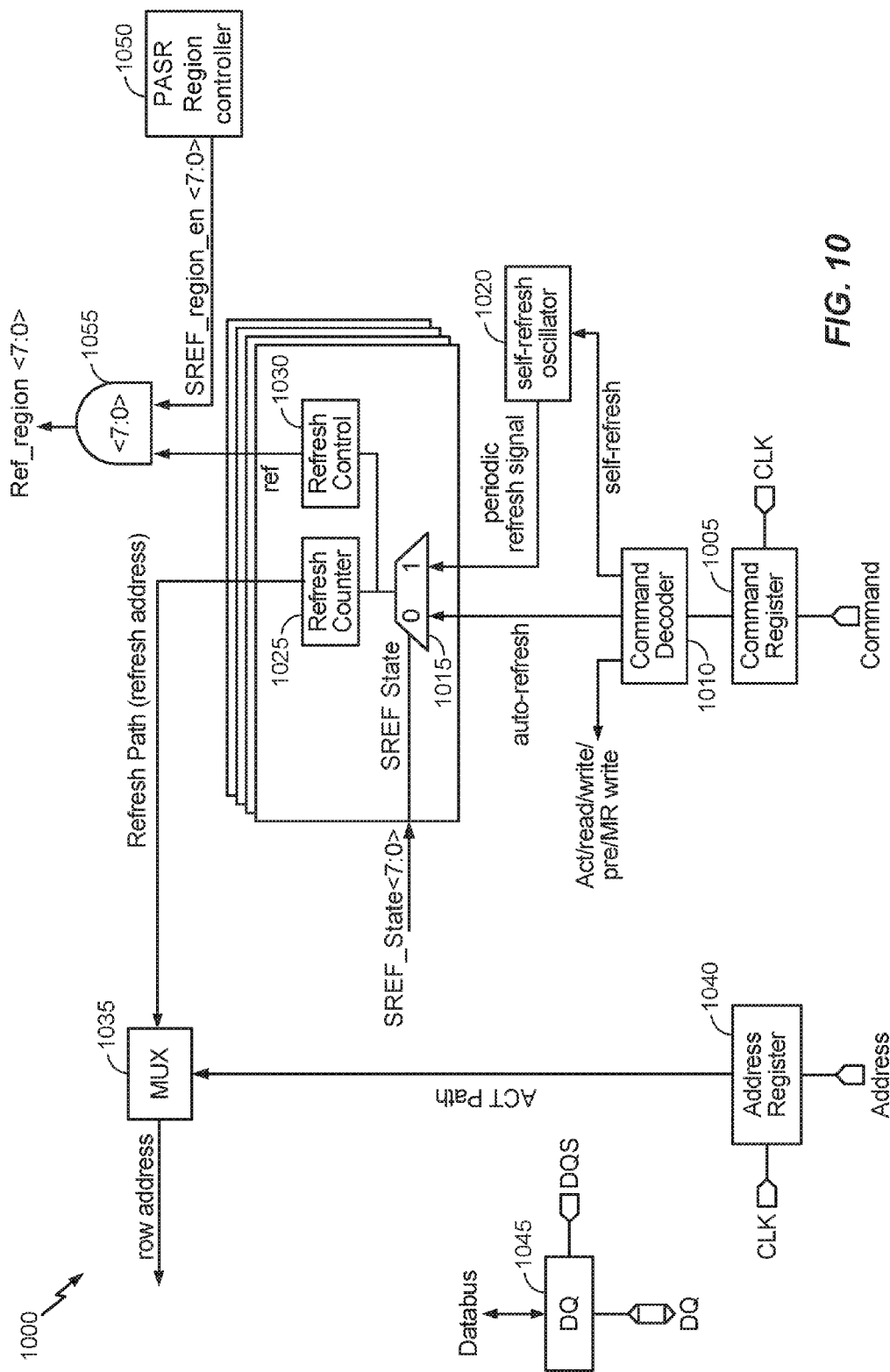
FIG. 10 illustrates a DRAM die controller configuration in accordance with an embodiment of the disclosure.

FIG. 10 illustrates a DRAM die controller configuration 1000 in accordance with an embodiment of the disclosure. The DRAM die controller configuration 1000 is an alternative to the DRAM die controller configuration 500D described above with respect to FIG. 5D. The DRAM die controller configuration 1000 may be deployed in conjunction with the DRAM die memory configurations 500B-500C described above with respect to FIGS. 5B-5C, so further illustration and description of the DRAM die memory configurations 500B-500C has been omitted for the sake of brevity. The DRAM die controller configuration 1000 may be representative of at least part of a logical portion of the integrated DRAM die controller 135 of FIG. 1 or the integrated DRAM die controller 840 of FIG. 8.

Referring to FIG. 10, components 1005 to 1010 and 1035 to 1055 substantially correspond to components 505D to 510D and 535D to 545D of FIG. 5D, respectively (except that the Command processed by the respective components may be region-specific in terms of refresh mode, in contrast to FIG. 5D), and as such will not be described further for the sake of brevity. Components 1050 and 1055 are optional for scenarios where region-specific PASR mode is supported, as discussed above with respect to FIG. 7D.

Unlike the DRAM die controller configuration 500A of FIG. 5A or 500D of FIG. 5D, the DRAM die controller configuration 1000 includes an arrangement of N refresh selectors 1015, N refresh counters 1025, and N refresh controls 1030, whereby N is an integer greater than or equal to 2 and set equal to the number of regions to be controlled individually. So, even though one particular instance of the arrangement of the refresh selector 1015, the refresh counter 1025 and the refresh control 1030 is depicted in FIG. 10 for one of regions 0 . . . 7, an additional arrangement of the refresh selector 1015, the refresh counter 1025 and the refresh control 1030 is also deployed in association with each additional region. So, in the example where there are eight regions (i.e., N=8) denoted as regions 0 . . . 7, eight separate arrangements of the refresh selector 1015, the refresh counter 1025 and the refresh control 1030 are deployed within the DRAM die controller configuration 1000.

The outputs of the N refresh controls 1030 are input to a self-refresh control circuit 1055, with the region control output functioning as a filter that restricts the regions to be targeted for a self-refresh command (or no refresh command). In an example, the self-refresh control circuit 1055 may be implemented as 7 discrete AND gates, but in other embodiments can be made of similar logic to gate refresh to certain regions in a targeted (or individual) basis. In an example, each bit in bus SREF_region_en that is output by the region control 1050 corresponds to control of enabling SREF for a particular region. When the SREF_region_en<n> bit is de-asserted, the AND gate blocks ref coming out of 1030 to the corresponding region. The self-refresh control circuit 1055 in turn outputs the self-refresh command (or no refresh command) to the appropriate region(s).

Referring to FIG. 10, unlike FIG. 5A or FIG. 5D, where individual regions cannot be in different refresh modes (e.g., controller-managed refresh mode and self-refresh mode) at the same time, the DRAM die controller configuration 1000 of FIG. 10 permits particular regions to follow SREF or controller-managed refresh mode (or AREF) based on information in a command received from an external controller (e.g., DDR controller 120 of FIG. 1 or controller 805 of FIG. 8) or by programming mode registers (not shown in FIG. 10 explicitly, but described above with respect to mode registers 860 of FIG. 8). As noted above, the DRAM die controller configuration 1000 of FIG. 10 can be used to implement at least part of a logical portion of an integrated DRAM die controller.

Figure 11:
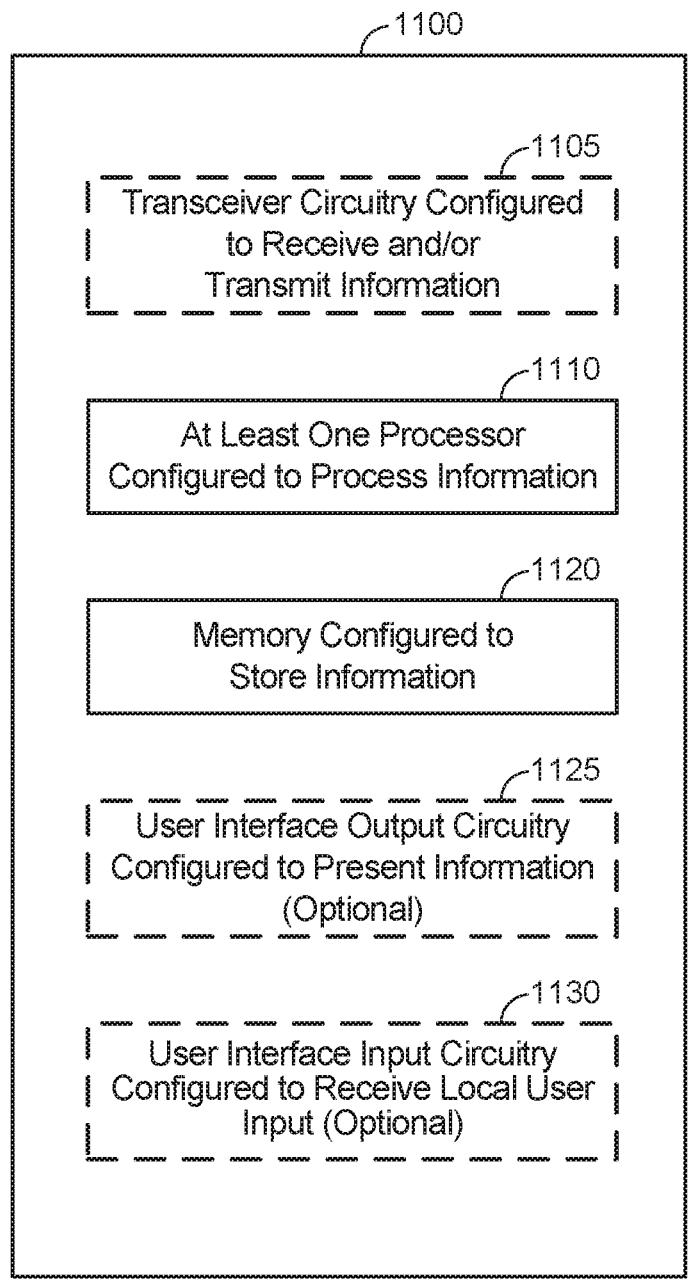
FIG. 11 illustrates a DRAM system that includes structural components in accordance with an embodiment of the disclosure.

FIG. 11 illustrates a DRAM system 1100 that includes structural components in accordance with an embodiment of the disclosure. The DRAM system 1100 can correspond to any of the above-noted DRAM systems, including but not limited to DRAM system 100 of FIG. 1 or DRAM system 800 of FIG. 8.

Referring to FIG. 11, the DRAM system 1100 optionally includes transceiver circuitry configured to receive and/or transmit information 1105. In an example, if the DRAM system 1100 corresponds to a wireless communications device (e.g., a user equipment such as a smart phone or tablet computer, a laptop or desktop computer, etc.), the transceiver circuitry configured to receive and/or transmit information 1105 can include a wireless communications interface (e.g., Bluetooth, Wi-Fi, Wi-Fi Direct, Long-Term Evolution (LTE) Direct, etc.) such as a wireless transceiver and associated hardware (e.g., an RF antenna, a MODEM, a modulator and/or demodulator, etc.). In another example, the transceiver circuitry configured to receive and/or transmit information 1105 can correspond to a wired communications interface (e.g., a serial connection, a USB or Firewire connection, an Ethernet connection through which the Internet can be accessed, etc.). Thus, if the DRAM system 1100 corresponds to some type of network-based server (e.g., an application server), the transceiver circuitry configured to receive and/or transmit information 1105 can correspond to an Ethernet card, in an example, that connects the network-based server to other communication entities via an Ethernet protocol. In a further example, the transceiver circuitry configured to receive and/or transmit information 1105 can include sensory or measurement hardware by which the DRAM system 1100 can monitor its local environment (e.g., an accelerometer, a temperature sensor, a light sensor, an antenna for monitoring local RF signals, etc.). The transceiver circuitry configured to receive and/or transmit information 1105 can also include software that, when executed, permits the associated hardware of the transceiver circuitry configured to receive and/or transmit information 1105 to perform its reception and/or transmission function(s). However, the transceiver circuitry configured to receive and/or transmit information 1105 does not correspond to software alone, and the transceiver circuitry configured to receive and/or transmit information 1105 relies at least in part upon structural hardware to achieve its functionality. Moreover, the transceiver circuitry configured to receive and/or transmit information 1105 may be implicated by language other than "receive" and "transmit", so long as the underlying function corresponds to a receive or transmit function. For an example, functions such as obtaining, acquiring, retrieving, measuring, etc., may be performed by the transceiver circuitry configured to receive and/or transmit information 1105 in certain contexts as being specific types of receive functions. In another example, functions such as sending, delivering, conveying, forwarding, etc., may be performed by the transceiver circuitry configured to receive and/or transmit information 1105 in certain contexts as being specific types of transmit functions. Other functions that correspond to other types of receive and/or transmit functions may also be performed by the transceiver circuitry configured to receive and/or transmit information 1105.

Referring to FIG. 11, the DRAM system 1100 further includes at least one processor configured to process information 1100 (e.g., the processor 110 or DDR controller 120 of FIG. 1, the controller 805 of FIG. 8, etc.) Example implementations of the type of processing that can be performed by the at least one processor configured to process information 1100 includes but is not limited to performing determinations, establishing connections, making selections between different information options, performing evaluations related to data, interacting with sensors coupled to the DRAM system 1100 to perform measurement operations, converting information from one format to another (e.g., between different protocols such as .wmv to .avi, etc.), and so on. For example, the at least one processor configured to process information 1100 can include a general purpose processor, a DSP, an ASIC, a field programmable gate array (FPGA) or other programmable logic device, discrete gate or transistor logic, discrete hardware components, or any combination thereof designed to perform the functions described herein. A general purpose processor may be a microprocessor, but in the alternative, the at least one processor configured to process information 1100 may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration). The at least one processor configured to process information 1100 can also include software that, when executed, permits the associated hardware of the at least one processor configured to process information 1100 to perform its processing function(s). However, the at least one processor configured to process information 1100 does not correspond to software alone, and the at least one processor configured to process information 1100 relies at least in part upon structural hardware to achieve its functionality. Moreover, the at least one processor configured to process information 1100 may be implicated by language other than "processing", so long as the underlying function corresponds to a processing function. For an example, functions such as evaluating, determining, calculating, identifying, etc., may be performed by the at least one processor configured to process information 1100 in certain contexts as being specific types of processing functions. Other functions that correspond to other types of processing functions may also be performed by the at least one processor configured to process information 1100.

Referring to FIG. 11, the DRAM system 1100 further includes memory configured to store information 1115 (e.g., DRAM die 125 of FIG. 1, the DRAM die 830 of FIG. 8, etc.). In an example, the memory configured to store information 1115 can include at least a non-transitory memory and associated hardware (e.g., a memory controller, etc.). For example, the non-transitory memory included in the memory configured to store information 1115 can correspond to RAM, DRAM, flash memory, ROM, erasable programmable ROM (EPROM), EEPROM, registers, hard disk, a removable disk, a CD-ROM, or any other form of storage medium known in the art. The memory configured to store information 1115 can also include software that, when executed, permits the associated hardware of the memory configured to store information 1115 to perform its storage function(s). However, the memory configured to store information 1115 does not correspond to software alone, and the memory configured to store information 1115 relies at least in part upon structural hardware to achieve its functionality. Moreover, the memory configured to store information 1115 may be implicated by language other than "storing", so long as the underlying function corresponds to a storing function. For an example, functions such as caching, maintaining, etc., may be performed by the memory configured to store information 1115 in certain contexts as being specific types of storing functions. Other functions that correspond to other types of storing functions may also be performed by the memory configured to store information 1115.

Referring to FIG. 11, the DRAM system 1100 further optionally includes user interface output circuitry configured to present information 1120. In an example, the user interface output circuitry configured to present information 1120 can include at least an output device and associated hardware. For example, the output device can include a video output device (e.g., a display screen, a port that can carry video information such as USB, HDMI, etc.), an audio output device (e.g., speakers, a port that can carry audio information such as a microphone jack, USB, HDMI, etc.), a vibration device and/or any other device by which information can be formatted for output or actually outputted by a user or operator of the DRAM system 1100. For example, the user interface output circuitry configured to present information 1120 can include a display. In a further example, the user interface output circuitry configured to present information 1120 can be omitted for certain communications devices, such as network communications devices that do not have a local user (e.g., network switches or routers, remote servers, etc.). The user interface output circuitry configured to present information 1120 can also include software that, when executed, permits the associated hardware of the user interface output circuitry configured to present information 1120 to perform its presentation function(s). However, the user interface output circuitry configured to present information 1120 does not correspond to software alone, and the user interface output circuitry configured to present information 1120 relies at least in part upon structural hardware to achieve its functionality. Moreover, the user interface output circuitry configured to present information 1120 may be implicated by language other than "presenting", so long as the underlying function corresponds to a presenting function. For an example, functions such as displaying, outputting, prompting, conveying, etc., may be performed by the user interface output circuitry configured to present information 1120 in certain contexts as being specific types of presenting functions. Other functions that correspond to other types of storing functions may also be performed by the user interface output circuitry configured to present information 1120.

Referring to FIG. 11, the DRAM system 1100 further optionally includes user interface input circuitry configured to receive local user input 1125. In an example, the user interface input circuitry configured to receive local user input 1125 can include at least a user input device and associated hardware. For example, the user input device can include buttons, a touchscreen display, a keyboard, a camera, an audio input device (e.g., a microphone or a port that can carry audio information such as a microphone jack, etc.), and/or any other device by which information can be received from a user or operator of the DRAM system 1100. For example, the user interface input circuitry configured to receive local user input 1125 can include buttons, a display (if a touchscreen), etc. In a further example, the user interface input circuitry configured to receive local user input 1125 can be omitted for certain communications devices, such as network communications devices that do not have a local user (e.g., network switches or routers, remote servers, etc.). The user interface input circuitry configured to receive local user input 1125 can also include software that, when executed, permits the associated hardware of the user interface input circuitry configured to receive local user input 1125 to perform its input reception function(s). However, the user interface input circuitry configured to receive local user input 1125 does not correspond to software alone, and the user interface input circuitry configured to receive local user input 1125 relies at least in part upon structural hardware to achieve its functionality. Moreover, the user interface input circuitry configured to receive local user input 1125 may be implicated by language other than "receiving local user input", so long as the underlying function corresponds to a receiving local user function. For an example, functions such as obtaining, receiving, collecting, etc., may be performed by the user interface input circuitry configured to receive local user input 1125 in certain contexts as being specific types of receiving local user functions. Other functions that correspond to other types of receiving local user input functions may also be performed by the user interface input circuitry configured to receive local user input 1125.

Referring to FIG. 11, while the configured structural components of 1105 through 1125 are shown as separate or distinct blocks in FIG. 11 that are implicitly coupled to each other via an associated communication bus (not shown expressly), it will be appreciated that the hardware and/or software by which the respective configured structural components of 1105 through 1125 performs their respective functionality can overlap in part. For example, any software used to facilitate the functionality of the configured structural components of 1105 through 1125 can be stored in the non-transitory memory associated with the memory configured to store information 1115, such that the configured structural components of 1105 through 1125 each performs their respective functionality (i.e., in this case, software execution) based in part upon the operation of software stored by the memory configured to store information 1115. Likewise, hardware that is directly associated with one of the configured structural components of 1105 through 1125 can be borrowed or used by other of the configured structural components of 1105 through 1125 from time to time. For example, the at least one processor configured to process information 1100 can format data into an appropriate format before being transmitted by the transceiver circuitry configured to receive and/or transmit information 1105, such that the transceiver circuitry configured to receive and/or transmit information 1105 performs its functionality (i.e., in this case, transmission of data) based in part upon the operation of structural hardware associated with the at least one processor configured to process information 1100.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

While the foregoing disclosure shows illustrative embodiments of the disclosure, it should be noted that various changes and modifications could be made herein without departing from the scope of the disclosure as defined by the appended claims. The functions, steps and/or actions of the method claims in accordance with the embodiments of the disclosure described herein need not be performed in any particular order. Furthermore, although elements of the disclosure may be described or claimed in the singular, the plural is contemplated unless limitation to the singular is explicitly stated.

What is claimed is:

1. A method of performing refresh operations within a dynamic random-access memory (DRAM) system, comprising:
   configuring an inactive portion of a DRAM die to operate in accordance with a self-refresh mode that is characterized by refreshes of the DRAM die being controlled by a local DRAM die controller integrated into the DRAM die; and
   configuring an active portion of the DRAM die to operate in accordance with a controller-managed refresh mode while the inactive portion of the DRAM die operates in the self-refresh mode, the controller-managed refresh mode is characterized by refreshes of the DRAM die being controlled by a controller that is external to the DRAM die.

2. The method of claim 1, further comprising:
   determining the active portion of the DRAM die and the inactive portion of the DRAM die.

3. The method of claim 2, wherein the configuring of the active portion and the configuring of the inactive portion are performed in response to the determining.

4. The method of claim 3, wherein the determining determines at least one other portion of the DRAM die to be inactive, further comprising:
   configuring, in response to the determination of the at least one other inactive portion, the at least one other inactive portion of the DRAM die to operate in accordance with no-refresh mode that is characterized by no refreshes of the DRAM die.

5. The method of claim 2, wherein the determining includes:
   starting a set of timers for a set of regions of the DRAM die that each have a given expiration period and are each configured to track a time elapsed from a previous memory access request to an associated region.

6. The method of claim 5, wherein the determining further includes:
   determining the active portion of the DRAM die as any region where the time elapsed for the previous memory access request does not exceed the given expiration period, and
   determining the inactive portion of the DRAM die as any region where the time elapsed for the previous memory access request exceeds the given expiration period.

7. The method of claim 1, further comprising:
   determining a transition of a memory region corresponding to the inactive portion to an active state; and
   reconfiguring, in response to the determined transition, the memory region to operate in accordance the controller-managed refresh mode.

8. The method of claim 1, further comprising:
   determining a transition of a memory region corresponding to the active portion to an inactive state; and
   reconfiguring, in response to the determined transition, the memory region to operate in accordance the self-refresh mode.

9. The method of claim 1,
   wherein refreshes to the inactive portion of the DRAM die in the self-refresh mode occur at a first refresh rate that is specified by a vendor of the DRAM die, and
   wherein refreshes to the active portion of the DRAM die in the controller-managed refresh mode occur at a second refresh rate that is specified by a DRAM specification.

10. The method of claim 9, wherein the first refresh rate is longer and consumes a lower amount of power relative to the second refresh rate.

11. A dynamic random-access memory (DRAM) system, comprising:
    a DRAM die containing a local DRAM die controller integrated therein; and
    a controller that is external to the DRAM die and configured to:
       configure an inactive portion of the DRAM die to operate in accordance with a self-refresh mode that is characterized by refreshes of the DRAM die being controlled by the integrated DRAM die controller, and
       configure an active portion of the DRAM die to operate in accordance with a controller-managed refresh mode while the inactive portion of the DRAM die operates in the self-refresh mode, the controller-managed refresh mode characterized by refreshes of the DRAM die being controlled by the external controller.

12. The DRAM system of claim 11, wherein the external controller is further configured to determine the active portion of the DRAM die and the inactive portion of the DRAM die.

13. The DRAM system of claim 12, wherein the external controller is further configured to configure the inactive portion for operation in the self-refresh mode and the inactive portion for operation in the controller-managed refresh mode in response to the determination.

14. The DRAM system of claim 12, wherein the external controller is further configured to:
determine at least one other portion of the DRAM die to be inactive; and
configure, in response to the determination of the at least one other inactive portion, the at least one other inactive portion of the DRAM die to operate in accordance with no-refresh mode that is characterized by no refreshes of the DRAM die.

15. The DRAM system of claim 12, wherein the external controller determines the active portion of the DRAM die and the inactive portion of the DRAM die by:
starting a set of timers for a set of regions of the DRAM die that each have a given expiration period and are each configured to track a time elapsed from a previous memory access request to an associated region.

16. The DRAM system of claim 15, wherein the external controller determines the active portion of the DRAM die and the inactive portion of the DRAM die further by:
determining the active portion of the DRAM die as any region where the time elapsed for the previous memory access request does not exceed the given expiration period, and
determining the inactive portion of the DRAM die as any region where the time elapsed for the previous memory access request exceeds the given expiration period.

17. The DRAM system of claim 11, wherein the external controller is further configured to:
determine a transition of a memory region corresponding to the inactive portion to an active state; and
reconfigure, in response to the determined transition, the memory region to operate in accordance the controller-managed refresh mode.

18. The DRAM system of claim 11, wherein the external controller is further configured to:
determine a transition of a memory region corresponding to the active portion to an inactive state; and
reconfigure, in response to the determined transition, the memory region to operate in accordance the self-refresh mode.

19. The DRAM system of claim 11,
wherein refreshes to the inactive portion of the DRAM die in the self-refresh mode occur at a first refresh rate that is specified by a vendor of the DRAM die, and
wherein refreshes to the active portion of the DRAM die in the controller-managed refresh mode occur at a second refresh rate that is specified by a DRAM specification.

20. The DRAM system of claim 19, wherein the first refresh rate is longer and consumes a lower amount of power relative to the second refresh rate.

21. A dynamic random-access memory (DRAM) system, comprising:
means for configuring an inactive portion of a DRAM die to operate in accordance with a self-refresh mode that is characterized by refreshes of the DRAM die being controlled by a local DRAM die controller integrated into the DRAM die; and
means for configuring an active portion of the DRAM die to operate in accordance with a controller-managed refresh mode while the inactive portion of the DRAM die operates in the self-refresh mode, the controller-managed refresh mode characterized by refreshes of the DRAM die being controlled by a controller that is external to the DRAM die.

22. The DRAM system of claim 21, further comprising:
means for determining the active portion of the DRAM die and the inactive portion of the DRAM die.

23. The DRAM system of claim 22, wherein the means for determining determines the active portion of the DRAM die and the inactive portion of the DRAM die by starting a set of timers for a set of regions of the DRAM die that each have a given expiration period and are each configured to track a time elapsed from a previous memory access request to an associated region, determining the active portion of the DRAM die as any region where the time elapsed for the previous memory access request does not exceed the given expiration period, and determining the inactive portion of the DRAM die as any region where the time elapsed for the previous memory access request exceeds the given expiration period.

24. The DRAM system of claim 2,
wherein the means for determining is further configured to determine at least one other portion of the DRAM die to be inactive, further comprising:
means for configuring, in response to the determination of the at least one other inactive portion, the at least one other inactive portion of the DRAM die to operate in accordance with no-refresh mode that is characterized by no refreshes of the DRAM die.

25. The DRAM system of claim 21,
wherein refreshes to the inactive portion of the DRAM die in the self-refresh mode occur at a first refresh rate that is specified by a vendor of the DRAM die, and
wherein refreshes to the active portion of the DRAM die in the controller-managed refresh mode occur at a second refresh rate that is specified by a DRAM specification.

26. A non-transitory computer-readable medium containing instructions stored thereon, which, when executed by a dynamic random-access memory (DRAM) system, cause the DRAM system to perform operations, the instructions comprising:
at least one instruction to cause the DRAM system to configure an inactive portion of a DRAM die to operate in accordance with a self-refresh mode that is characterized by refreshes of the DRAM die being controlled by a local DRAM die controller integrated into the DRAM die; and
at least one instruction to cause the DRAM system to configure an active portion of the DRAM die to operate in accordance with a controller-managed refresh mode while the inactive portion of the DRAM die operates in the self-refresh mode, the controller-managed refresh mode characterized by refreshes of the DRAM die being controlled by a controller that is external to the DRAM die.

27. The non-transitory computer-readable medium of claim 26, further comprising:
at least one instruction to cause the DRAM system to determine the active portion of the DRAM die and the inactive portion of the DRAM die.

28. The non-transitory computer-readable medium of claim 27, wherein the at least one instruction to cause the DRAM system to determine includes:

at least one instruction to cause the DRAM system to start a set of timers for a set of regions of the DRAM die that each have a given expiration period and are each configured to track a time elapsed from a previous memory access request to an associated region, at least one instruction to cause the DRAM system to determine the active portion of the DRAM die as any region where the time elapsed for the previous memory access request does not exceed the given expiration period, and at least one instruction to cause the DRAM system to determine the inactive portion of the DRAM die as any region where the time elapsed for the previous memory access request exceeds the given expiration period.

29. The non-transitory computer-readable medium of claim 27, wherein the at least one instruction to cause the DRAM system to determine further includes at least one instruction to cause the DRAM system to determine another portion of the DRAM die to be inactive, further comprising:

at least one instruction to cause the DRAM system to configure, in response to the determination of the at least one other inactive portion, the at least one other inactive portion of the DRAM die to operate in accordance with no-refresh mode that is characterized by no refreshes of the DRAM die.

30. The non-transitory computer-readable medium of claim 26, wherein refreshes to the inactive portion of the DRAM die in the self-refresh mode occur at a first refresh rate that is specified by a vendor of the DRAM die, and wherein refreshes to the active portion of the DRAM die in the controller-managed refresh mode occur at a second refresh rate that is specified by a DRAM specification.

* * * * *